US006970527B2

(12) United States Patent
Kumata

(10) Patent No.: US 6,970,527 B2
(45) **Date of Patent: *Nov. 29, 2005**

(54) TRANSMITTING CIRCUIT AND METHOD THEREOF, RECEIVING CIRCUIT AND METHOD THEREOF, AND DATA COMMUNICATION APPARATUS

(75) Inventor: Ichiro Kumata, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/089,811

(22) Filed: Mar. 25, 2005

(65) Prior Publication Data

US 2005/0169414 A1 Aug. 4, 2005

Related U.S. Application Data

(63) Continuation of application No. 09/824,969, filed on Apr. 3, 2001.

(30) Foreign Application Priority Data

Apr. 5, 2000 (JP) ............................ 2000-108039

(51) Int. Cl.[7] ......................... H04L 7/00; H04L 12/43; G11B 5/02

(52) U.S. Cl. ......................... 375/354; 360/22; 370/458

(58) Field of Search ................................ 375/295, 350, 375/354; 370/359, 376; 360/22; 340/146.1; 346/74; 327/277, 284

(56) References Cited

U.S. PATENT DOCUMENTS

| | | | |
|---|---|---|---|
| 3,685,021 | A | 8/1972 | Mauch et al. |
| 4,161,719 | A | 7/1979 | Parikh et al. |
| 4,191,969 | A | 3/1980 | Briand et al. |
| 4,253,115 | A | 2/1981 | Kergosien et al. |
| 4,674,086 | A | 6/1987 | Szczepanek et al. |
| 4,760,573 | A | 7/1988 | Calvignac et al. |
| 4,894,819 | A | 1/1990 | Kondo et al. |
| RE34,896 | E | 4/1995 | Calvignac et al. |
| 5,563,603 | A | 10/1996 | Aker et al. |
| 5,892,384 | A | 4/1999 | Yamada et al. |
| 5,894,517 | A | 4/1999 | Hutchison et al. |
| 6,697,419 | B1 | 2/2004 | Pascal |

*Primary Examiner*—Kenneth Vanderpuye
*Assistant Examiner*—Lawrence B. Williams
(74) *Attorney, Agent, or Firm*—Frommer Lawrence & Haug LLP; William S. Frommer; Thomas F. Presson

(57) ABSTRACT

A method of frame synchronization serial data transmission. A transmitting circuit in a data communication apparatus converts frame data into serial data and transmit the same, and following the serial data, the transmitting circuit transmits frame synchronization data varying several times in the interval from an edge of a clock signal to an edge of the next clock signal; a receiving circuit receives the frame data and detects twice or more variations in the same interval to find out the end of the frame data, by receiving the serial data from a signal lines, serial data is transmitted while carrying out frame synchronization.

1 Claim, 18 Drawing Sheets

160 P/S CONVERSION CIRCUIT

210 RECEPTION CONTROL CIRCUIT

260 S/P CONVERSION CIRCUIT

310 TRANSMISSION CONTROL CIRCUIT

410 TRANSMISSION CONTROL CIRCUIT

510 RECEPTION CONTROL CIRCUIT

560 S/P CONVERSION CIRCUIT

TRANSMITTING CIRCUIT AND METHOD THEREOF, RECEIVING CIRCUIT AND METHOD THEREOF, AND DATA COMMUNICATION APPARATUS

This is a continuation of application Ser. No. 09/824,969 filed Apr. 3, 2001, the entirety of which is incorporated herein by reference.

BACKGROUND OF THE INVENTION

1. Field of the Invention

The present invention relates to a transmitting circuit and a method for transmitting serial data to a receiving circuit, a receiving circuit and a method for receiving serial data sent from a transmitting circuit, and a data communication apparatus comprising said transmitting circuit and receiving circuit.

2. Description of the Related Art

Transmission of serial data has been reported in numerous literatures. Some of them are introduced below.

Japanese Unexamined Patent Publication (Kokai) No. 11-178349 disclosed an invention of a pulse width modulation control apparatus for transmitting serial data.

Japanese Unexamined Patent Publication (Kokai) No. 11-145944 disclosed a signal synchronization detection circuit for transmitting serial data.

Japanese Unexamined Patent Publication (Kokai) No. 11-74893 disclosed a data communication apparatus and a communication method thereof for transmitting serial data.

Japanese Unexamined Patent Publication (Kokai) No. 5-268210 and No. 6-21999 disclosed inventions of serial data communication apparatuses.

In the related art, frame synchronization during transmission of serial data was carried out by methods shown in the following (1) to (3).

(1) A signal line exclusively for frame synchronization is provided to transmit a frame synchronization signal.

(2) Streams of data are superposed in one signal line by means of frequency modulation or phase modulation and a frame synchronization signal is simultaneously transmitted.

(3) Data of a specific pattern is used as a frame synchronization signal. At the time of data transmission, the code of data is converted to a pattern other than the above frame synchronization signal. At the side of signal reception, data (or bits) corresponding to one frame is extracted based on the frame synchronization signal, and its data code is reversely converted to restore the original data.

The above method (1) has less signal lines for data transmission as a result of the serial transmission, but it needs more signal lines exclusively for frame synchronization because of the intermittently used frame synchronization signals.

The above method (2) and (3) need complicated circuits for code conversion and reverse conversion as well as modulation and demodulation.

In the above method (3), the end of a frame is not known until the whole serial data (a number of bits) corresponding to one frame synchronization pattern is received and compared with a predetermined pattern, so the time for receiving one frame is long.

SUMMARY OF THE INVENTION

An object of the present invention is to provide a data communication apparatus of a new configuration able to transmit data while carrying out frame synchronization, and a transmitting circuit and a method thereof and receiving circuit and a method thereof able to be used in the data communication apparatus.

In order to achieve the above object, according to a first aspect of the present invention, there is provided a transmitting circuit comprising a clock signal transmitting circuit for transmitting a clock signal through a first signal line, a synchronization data generating circuit for generating synchronization data which represents a delimiter of serial data being transmitted of a predetermined unit length, and whose value changes two or more times in a predetermined time interval associated with the clock signal, and a data transmitting circuit for superposing the generated synchronization data on each serial data of the unit length and for synchronizing the serial data with the clock signal and transmitting the serial data through a second signal line.

Preferably, as the synchronization data, the synchronization data generating circuit generates a set of data including inverted data of the last data of the unit-length serial data, and the last data after the inverted data.

Specifically, as the synchronization data, the synchronization data generating circuit generates data whose value changes two or more times in one cycle of the clock signal.

Preferably, when serial data synchronized with a clock signal is transmitted by the data transmitting circuit, as the synchronization data, the synchronization data generating circuit generates data whose value changes two or more times in one cycle of the clock signal.

Preferably, when the synchronization data is superposed and transmitted by the data transmitting circuit, the cycle length of the clock signal is extended, and thereby the synchronization data generating circuit generates synchronization data whose value changes two or more times in the extended cycle of the clock signal, and the clock signal transmitting circuit generates the clock signal of an extended cycle length when the synchronization data is superposed and transmitted.

Specifically, as the synchronization data, the synchronization data generating circuit generates data whose value changes two or more times within a period in which the level of the clock signal is constant, that is, from a rising edge to a next falling edge, or from a falling edge to a next rising edge of the clock signal.

Preferably, when serial data synchronized with a clock signal is transmitted by the data transmitting circuit, as the synchronization data, the synchronization data generating circuit generates data whose value changes two or more times within the period in which the level of the clock signal is constant.

Preferably, when the synchronization data is superposed and transmitted by the data transmitting circuit, the length of a constant level of the clock signal is extended, and thereby the synchronization data generating circuit generates synchronization data whose value changes two or more times in the extended period of a constant level of the clock signal, and the clock signal transmitting circuit generates the clock signal of an extended length of a constant level when the synchronization data is superposed and transmitted.

Preferably, the transmitting circuit further comprises a parallel-serial converting circuit for converting parallel data being transmitted to serial data, wherein the synchronization data generating circuit generates synchronization data representing a delimiter of the converted serial data of a predetermined unit length, the data transmitting circuit transmits the converted serial data.

According to a second aspect of the present invention, there is provided a method of transmission comprising steps of transmitting a clock signal through a first signal line, generating synchronization data which represents a delimiter of serial data being transmitted of a predetermined unit length, and whose value changes two or more times in a predetermined time interval associated with the clock signal, and superposing the generated synchronization data on each unit-length serial data, synchronizing the serial data with the clock signal and transmitting the serial data through a second signal line.

According to a third aspect of the present invention, there is provided a receiving circuit comprising a clock signal receiving circuit for receiving a clock signal transmitted through a first signal line, a serial data receiving circuit for receiving serial data synchronized with the clock signal and transmitted through a second signal line, a synchronization data detection circuit for detecting data from the received serial data and using the same as synchronization data, said data changing its value two or more times within a predetermined period associated with the received clock signal, and a data processing circuit for detecting the predetermined unit length of the received serial data by using the detected synchronization data as a delimiter.

Preferably, the data processing circuit converts the received serial data of the detected predetermined unit length to parallel data.

Preferably, when the synchronization data detection circuit detected a set of data including the first received serial data, inverted data of the first received serial data after that, and again the first received serial data after the inverted data, the inverted data and further the first data thereafter is used as the synchronization data, and the data processing circuit detects data of a predetermined unit length with the first data as the last data of the received serial data of the predetermined unit length.

Specifically, as the synchronization data, the synchronization data detection circuit detects data whose value changes two or more times in a cycle of the clock signal.

Further specifically, as the synchronization data, the synchronization data detection circuit detects data whose value changes two or more times within a period in which the level of the clock signal is constant, that is, from a rising edge to a next falling edge, or from a falling edge to a next rising edge of the clock signal.

According to a fourth aspect of the present invention, there is provided a method of reception comprising the steps of receiving a clock signal transmitted through a first signal line, receiving serial data synchronized with the clock signal and transmitted through a second signal line, detecting data from the received serial data as synchronization data, said data changing its value two or more times within a predetermined period associated with the received clock signal, and detecting the predetermined unit length of the received serial data by using the detected synchronization data as a delimiter.

According to a fifth aspect of the present invention, there is provided a data communication apparatus comprising a transmitting circuit including a clock signal transmitting circuit for transmitting a clock signal through a first signal line, a synchronization data generating circuit for generating synchronization data which represents a delimiter of serial data being transmitted of a predetermined unit length, and whose value changes two or more times in a predetermined time interval associated with the clock signal, and a data transmitting circuit for superposing the generated synchronization data on each serial data of the unit length and for synchronizing the serial data with the clock signal and transmitting the serial data, and a receiving circuit including a clock signal receiving circuit for receiving a clock signal transmitted through a first signal line, a serial data receiving circuit for receiving serial data synchronized with the clock signal and transmitted through a second signal line, a synchronization data detection circuit for detecting data from the received serial data as synchronization data, said data changing its value two or more times within a predetermined period associated with the received clock signal, and a data processing circuit for detecting the predetermined unit length of the received serial data as a delimiter of the detected synchronization data.

BRIEF DESCRIPTION OF THE DRAWINGS

These and other objects and features of the present invention will become clearer from the following description of the preferred embodiments given with reference to the accompanying drawings, in which.

DESCRIPTION OF THE PREFERRED EMBODIMENTS

Below, preferred embodiments of the present invention will be described with reference to the accompanying drawings.

First Embodiment

Figure 1:
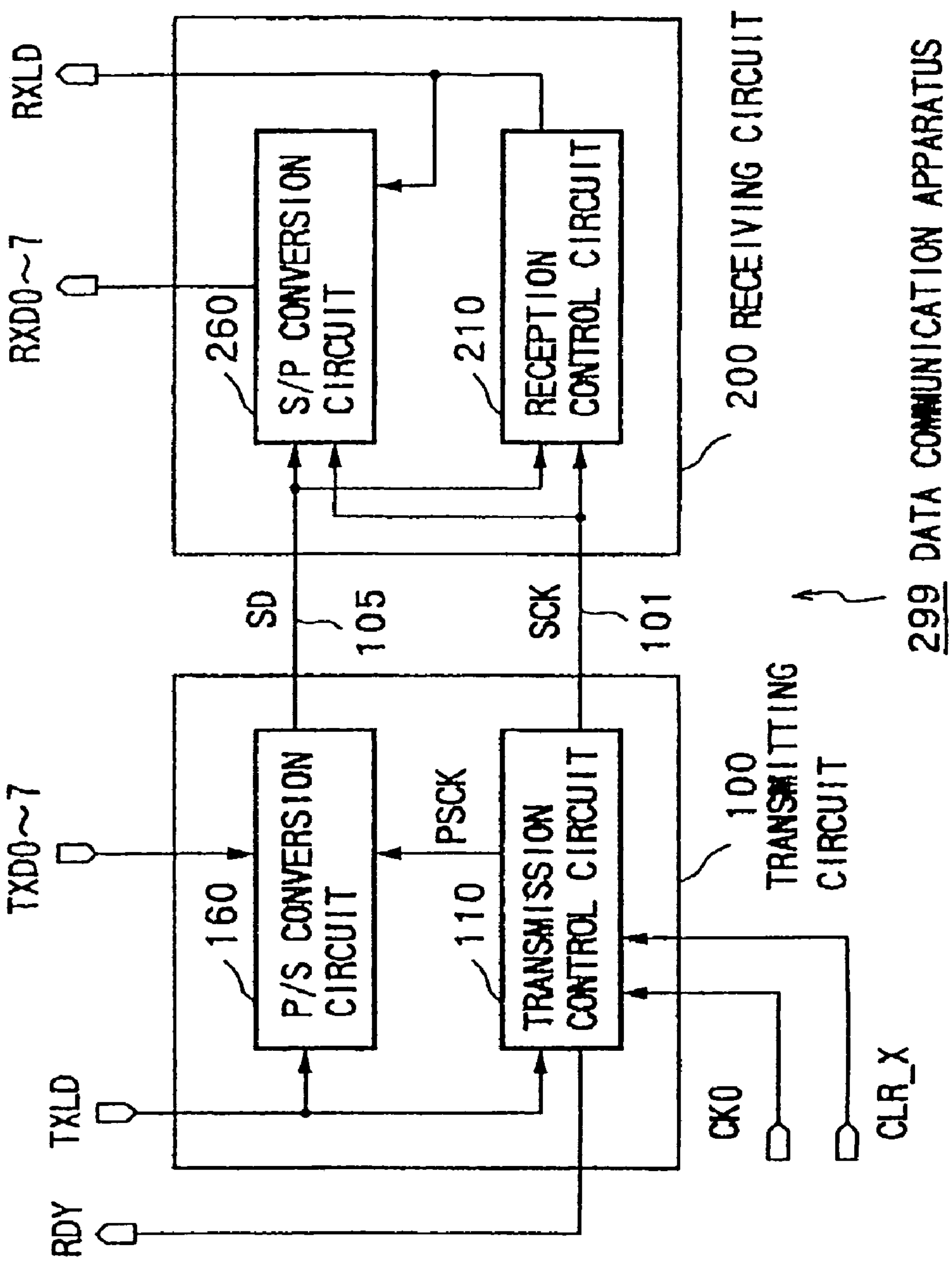
FIG. 1 is a schematic block diagram of a configuration of a data communication apparatus according to a first embodiment of the present invention.

FIG. 1 is a schematic block diagram of a configuration of a data communication apparatus according to a first embodiment of the present invention.

The data communication apparatus 299 comprises a transmitting circuit 100, a receiving circuit 200, and signal lines 101 and 105. The transmitting circuit 100 and receiving circuit 200 are connected by the signal lines 101 and 105.

The transmitting circuit 100 comprises a transmission control circuit 110 and a parallel/serial conversion circuit (P/S conversion circuit) 160.

The transmission control circuit 110 is input with a load signal TXLD for P/S conversion, a reference clock signal CK0 and a reset signal CLR_X.

This transmission control circuit 110 generates a ready signal RDY. In addition, it generates a clock signal SCK for serial data transmission and outputs the signal to the receiving circuit 200 through the signal line 101, and generates a clock signal PSCK for P/S conversion and outputs the signal to the P/S conversion circuit 160.

The P/S conversion circuit 160 is input with parallel data TXD0 to TXD7 (parallel data TXD0 to 7), the load signal TXLD for P/S conversion, and the clock signal PSCK for P/S conversion.

This P/S conversion circuit 160 converts the parallel data TXD0 to 7 to serial data and outputs the data to the receiving circuit 200 through the signal line 105.

Through the signal line 101, the clock signal SCK from the transmitting circuit 100 is sent to the receiving circuit 200.

Through the signal line 105, the data transmitted from the transmitting circuit 100 corresponding to the clock signal SCK is sent to the receiving circuit 200. The signal line 105 forms a serial transmission channel. Note that the difference of time delay between signal lines 101 and 105 is negligible compared with the pulse width of the clock signal SCK.

The receiving circuit 200 comprises a reception control circuit 210 and a serial/parallel conversion circuit (S/P conversion circuit) 260.

The reception control circuit 210 is input with transmitted data SD including serial data and frame synchronization data, and a clock signal SCK for serial data transmission.

This reception control circuit 210 generates a load signal RXLD for S/P conversion and outputs the signal to the S/P conversion circuit 260.

The S/P conversion circuit 260 is input with the transmitted data SD including serial data and frame synchronization data, a clock signal SCK for serial data transmission, and a load signal RXLD for S/P conversion.

The S/P conversion circuit 260 converts the serial data in the transmitted data SD to parallel data RXD0 to RXD7 (parallel data RXD0 to 7).

Figure 2:
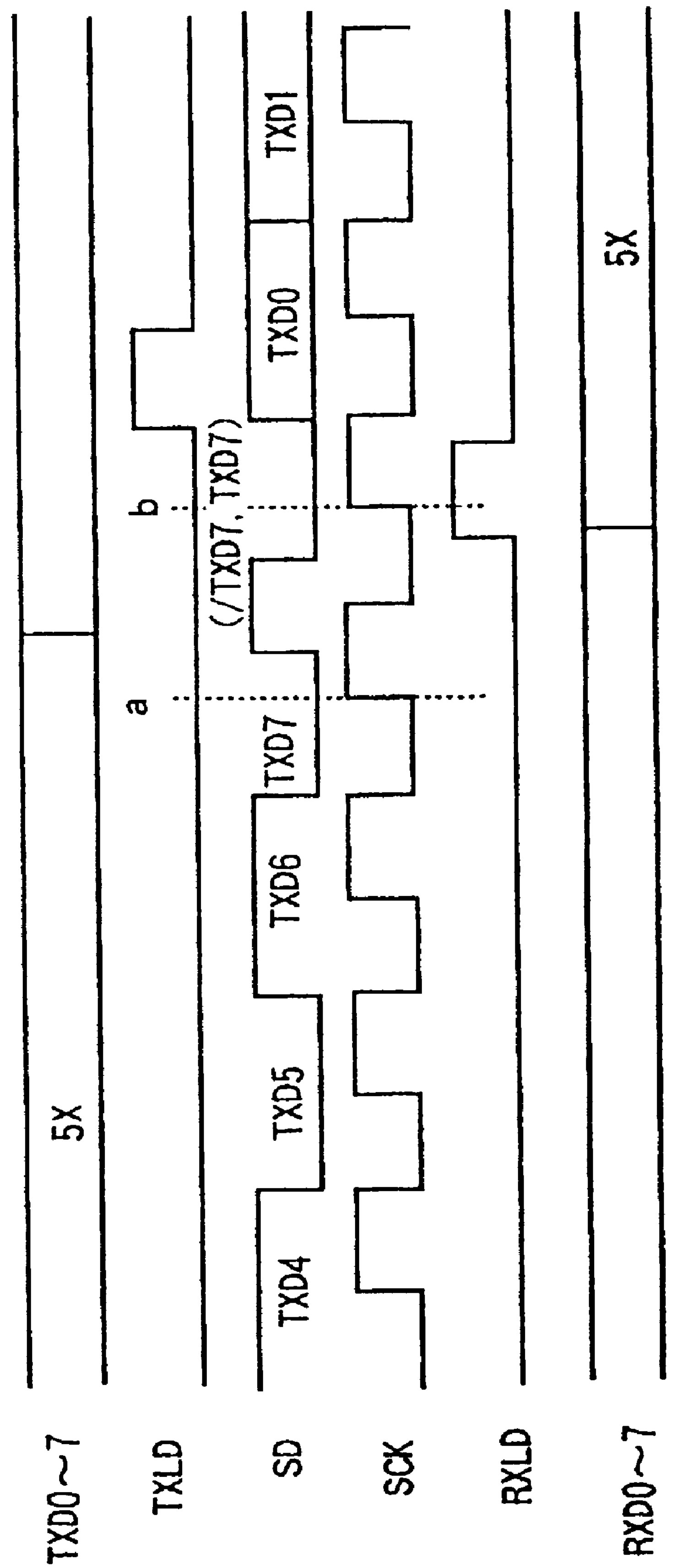
FIG. 2 is a schematic time chart of the data communication apparatus shown in FIG. 1.

FIG. 2 is a schematic time chart of the data communication apparatus 299 shown in FIG. 1.

This time chart shows that the last four bits (TXD 4 to 7) in the transmitted data for one frame are sent in series, and in the interval from a to b, that is, from a rising edge to a next rising edge of the clock signal SCK, frame synchronization data (end signal of frame) is transmitted, and the next frame transmission is started. In this example, the transmitted data SD is transmitted serially from the LSB side (Least Significant Bit).

The frame synchronization data includes the inverted data/TXD7 of data TXD7, and data TXD7 following this inverted data.

The transmitting circuit 100 in FIG. 1 synchronizes the serial data with a falling edge of the clock signal SCK and sends the data to the receiving circuit 200.

The receiving circuit 200 synchronizes the serial data with a rising edge of the clock signal SCK and stores the data in the shift register. In addition, in the interval from a rising edge to a next rising edge of the clock signal SCK, if the value of the transmitted data SD changes twice or more, this part of data is recognized as the frame synchronization data representing the end of one frame.

In FIG. 2, in the interval between a and b, the value of the transmitted data SD changes twice, so the reception control circuit 210 designates this part as the frame synchronization data.

Then, the reception control circuit 210 generates a load signal RXLD for S/P conversion. Based on the load signal RXLD, the S/P conversion circuit 260 moves data stored in the shift register to the frame register and generates parallel data RXD0 to 7 to restore the parallel data TXD0 to 7.

Figure 3:
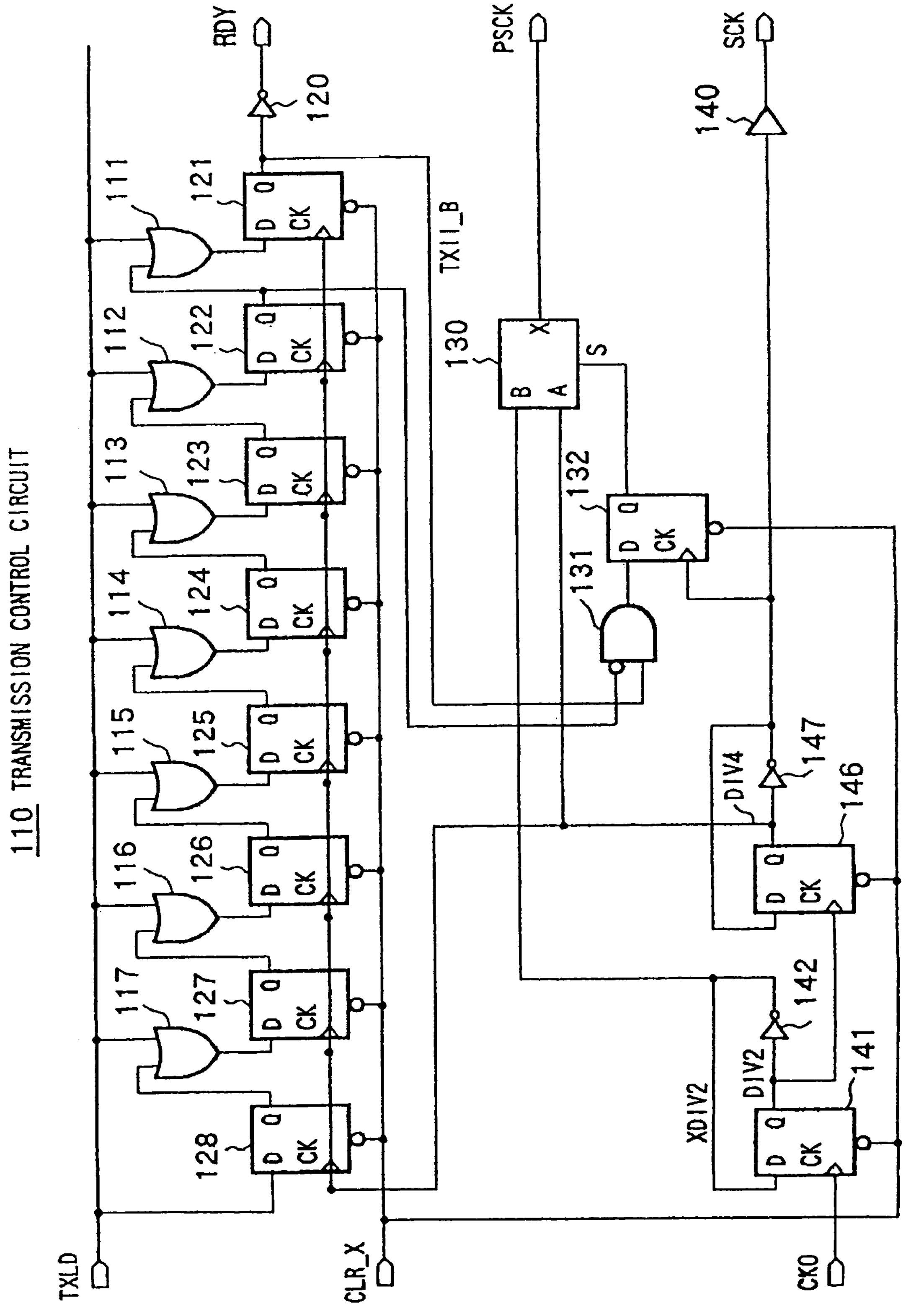
FIG. 3 is a circuit diagram of an embodiment of the transmission control circuit in FIG. 1.

FIG. 3 is a circuit diagram of an embodiment of the transmission control circuit shown in FIG. 1.

This transmission control circuit 110 includes logical sum circuits (OR circuit) 111 to 117, D-type flip-flop (DFF) 121 to 128, 132, 141 and 146, inversion circuits (NOT circuit) 120, 142 and 147, a buffer 140, a logical multiplication circuit (AND circuit) 131, and a select circuit 130.

One of the inputs of each OR circuit among OR circuits 111 to 117 is input with an output signal of a corresponding DFF among DFF 122 to 128, while the other input of each OR circuit is input with a load signal TXLD.

The data input D of each DFF of DFF 121 to 128 is input with an output signal from a corresponding OR circuit 111 to 117.

In addition, the input D of DFF 128 is input with a load signal TXLD.

The clock input CK of each DFF 121 to 128 is input with the output signal DIV4 of the DFF 144.

The inversion circuit 120 inverts the output signal TX11_B of the DFF 121 and generates a ready signal RDY.

The AND circuit 131 calculates the logical multiplication of the inverted output signal of DFF 122 and the output signal TXll_B of the DFF 121, and outputs the result to DFF 132.

The data input of DFF 132 is input with the output signal of the AND circuit 131, and the clock input CK is input with an output signal of the inversion circuit 147.

The input A of the select circuit 130 is input with the output signal DIV4 of DFF 146, the input B is input with the output signal XDIV2 of the inversion circuit 142, and the control terminal S is input with the output signal of DFF 132.

When the signal input to the control terminal S is at low level (or logical 0), the select circuit 130 selects the signal DIV4 to input A, and outputs a signal DIV4 from the output X as a clock signal PSCK.

When the signal input to the control terminal S is at high level (or logical 1), the select circuit 130 selects the signal XDIV2 supplied to the input B, and outputs a signal XDIV2 as a clock signal PSCK from the output X.

The data input D of DFF 141 is input with the output signal XDIV2 of the inversion circuit 142, and the clock input CK is input with a clock signal CK0.

DFF 141 inverts the output signal DIV2 and outputs the same to the inversion circuit 142 and the DFF 146.

The data input D of DFF 146 is input with an output signal of the inversion circuit 147, and the clock input CK is input with the output signal DIV2 of DFF 141.

DFF 146 supplies the output signal DIV4 to the clock inputs CK of DFF 121 to 128, inversion circuit 147, and the input A of the select circuit 130.

The inversion circuit 147 supplies the inverted signal of the output signal DIV4 of DFF 146 to the input D of DFF 146, the clock input CK of DFF 132, and the buffer 140.

The buffer 140 outputs the output signal of the inversion circuit 147 as a clock signal SCK for serial data transmission.

The reset terminals of DFF 121 to 128, 132, 141 and 146 are input with the reset signal CLR_X, and if the reset signal CLR_R is at low level, DFF 121 to 128, 132, 141 and 146 are reset.

The DFF 141 and inversion circuit 142 form a dividing circuit, which generates signals DIV2 and XDIV2 having periods two times that of the clock signal CK0.

The DFF 146 and inversion circuit 147 form a dividing circuit, which generates a signal DIV4 of a period twice as much as signal DIV2.

The select circuit 130 outputs the signal DIV4 as the clock signal PSCK for transmission of serial data, and outputs the signal XDIV2 as the clock signal PSCK for transmission of frame synchronization data.

Figure 4:
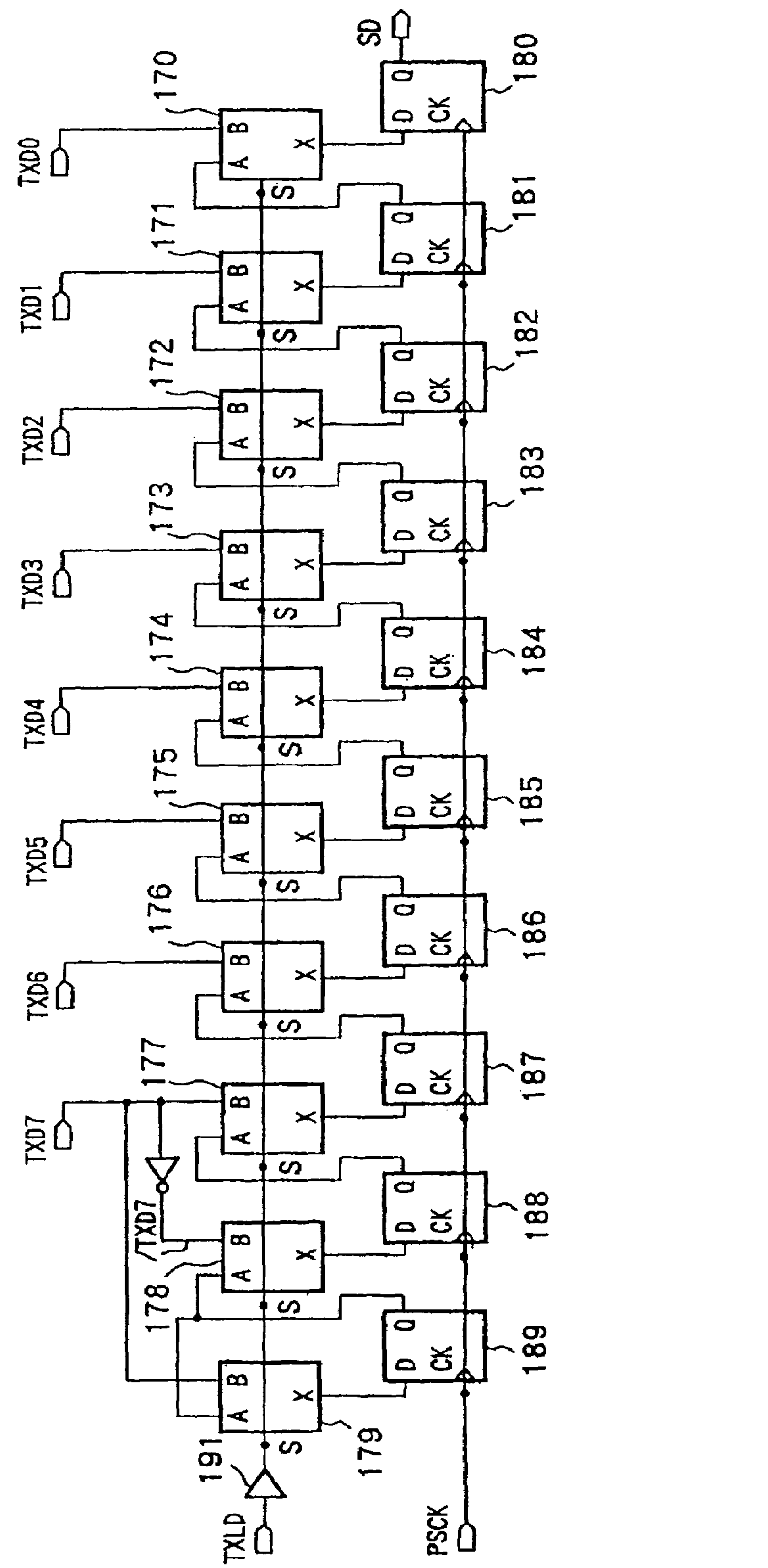
FIG. 4 is a circuit diagram of an embodiment of the P/S conversion circuit shown in FIG. 1.

FIG. 4 is a circuit diagram of an embodiment of the P/S conversion circuit shown in FIG. 1.

This P/S conversion circuit 160 includes a buffer 191, an inversion circuit 195, select circuits 170 to 179, and DFF 180 to 189.

The buffer 191 supplies the control terminals (select control terminal) S of the 10 select circuits 170 to 179 with the load signal TXLD.

The inversion circuit 195 generates inverted data (inverted signal)/TXD7 of data TXD7, and outputs the data to the select circuit 178.

The input A of each select circuit 170 to 178 is input with an output signal of a corresponding DFF among DFF 181 to 189, and the input A of the select circuit 179 is input with an output signal of DFF 189.

The input B of each select circuit 170 to 177 is input with corresponding parallel data TXD0 to 7. The input B of the select circuit 178 is input with the inverted data/TXD7, and the input B of the select circuit 179 is input with the data TXD7.

Each data input D of DFF 180 to 189 is input with an output signal of a corresponding select circuit among the select circuit 170 to 179, and the clock input CK is input with a clock signal PSCK for P/S conversion.

DFF 180 outputs the transmitted data SD from the output Q to the signal line 105.

In the P/S conversion circuit 160, when the load signal TXLD is at high level, the select circuits 170 to 177 select the parallel data TXD0 to 7 and supply the same to DFF 180 to 187, the select circuit 178 outputs the inverted data/TXD7 to DFF 188, and the select circuit 179 outputs data TXD7 to DFF 189.

Then, based on the clock signal PSCK, DFF 180 to 189 latch data input to the data inputs D of DFF 180 to 189.

In the P/S conversion circuit 160, when the load signal TXLD is at low level, the select circuits 170 to 177 select the output data (output signal) of DFF 181 to 189 and supply the same to DFF 180 to 188.

Then, DFF 180 to 189 latch data input to the data input D of DFF 180 to 189 based on the clock signal PSCK, converts the parallel data TXD0 to 7 to serial data, and outputs the transmitted data SD including the aforesaid serial data, inverted data/TXD7 and data TXD7 from DFF 180. The inverted data/TXD7 and data TXD7 are the frame synchronization data.

In this way, the transmitting circuit 100 in FIG. 1 sends the clock signal SCK to the receiving circuit 200 through the signal line 101, and sends the serial data SD to the receiving circuit 200 through the signal line 105.

The P/S conversion circuit 160 in the transmitting circuit 100 converts the parallel data TXD0 to 7 of one frame to serial data, synchronizes the serial data with a falling edge of the clock signal SCK and transmits the data. Following the transmission of the serial data, the P/S conversion circuit 160 transmits the frame synchronization data whose value changes N times (N is an integer not less than 2) in the interval from a rising edge to a next rising edge of the clock signal SCK.

Figure 5:
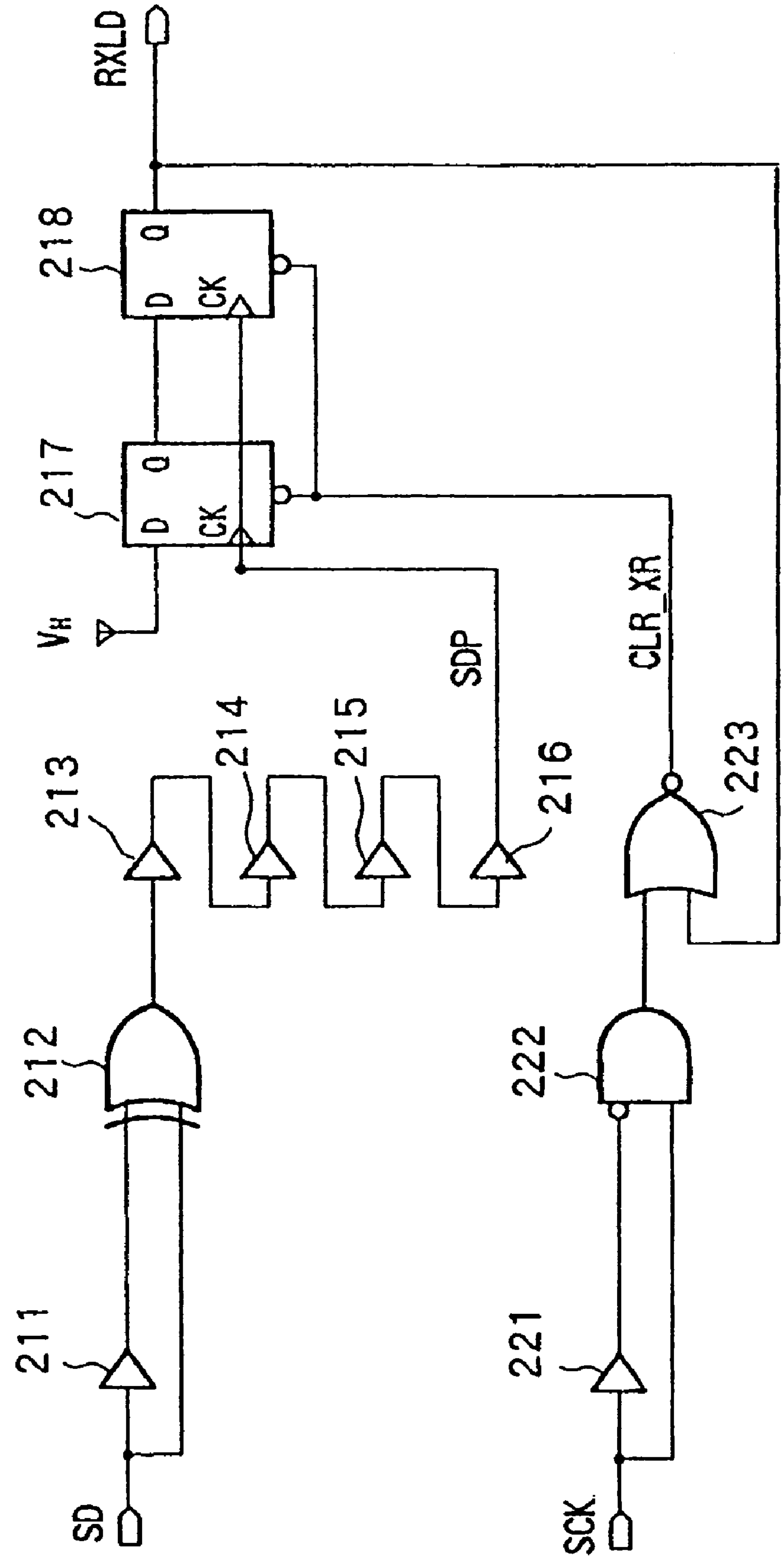
FIG. 5 is a circuit diagram of an embodiment of the reception control circuit shown in FIG. 1.

FIG. 5 is a circuit diagram of an embodiment of the reception control circuit shown in FIG. 1.

The reception control circuit 210 includes buffers 211, 213 to 216 and 221, exclusive logical sum circuit (EOR circuit) 212, logical multiplication circuit 222, logical sum circuits 223 and 217 and 218.

The buffer 211 buffers the transmitted data SD from the signal line 105 to delay the data, and outputs the data to the EOR circuit 212.

The EOR circuit 212 calculates the exclusive logical sum of the output data of the buffer 211 and the transmitted data SD, and thereby detect the change of the value of the transmitted data SD, and outputs a pulse representing the detection result to the buffer 213.

The buffers 213 to 216 are connected in series, and delay the pulse representing the detection result of the change of the value of the input transmitted data SD by a predetermined time period, and outputs the signal as an output signal SDP (data pulse) by the buffer 216 to the clock inputs CK of DFF 217 and 218.

The buffer 221 buffers the clock signal SCK from the signal line 101 to delay the signal, and outputs the signal to the AND circuit 222.

The AND circuit 222 calculates the logical multiplication of the inverted signal of the output signal of the buffer 221 and the clock signal SCK, and thereby detects a rising edge of the clock signal SCK, and outputs a pulse for the result to the OR circuit 223.

The OR circuit 223 calculates the logical sum of the output signal of the AND circuit 222 and the load signal RXLD, generates a signal CLR_XR representing the negation of the calculation result, and outputs the signal to the reset terminals of DFF 217 and 218.

The data input D of DFF 217 is set to the high level supplied by the voltage VH of the power supply.

The data input D of DFF 218 is input with an output signal of DFF 217. DFF 218 outputs the load signal RXLD from the output Q.

DFF 217 and 218 are reset at each rising edge of the clock signal SCK.

DFF 218 generates a high level load signal RXLD when the level of the signal SDP becomes high twice or more (namely, the value of the transmitted data changes twice or more) in the interval from a rising edge of the clock signal SCK to its next rising edge.

Figure 6:
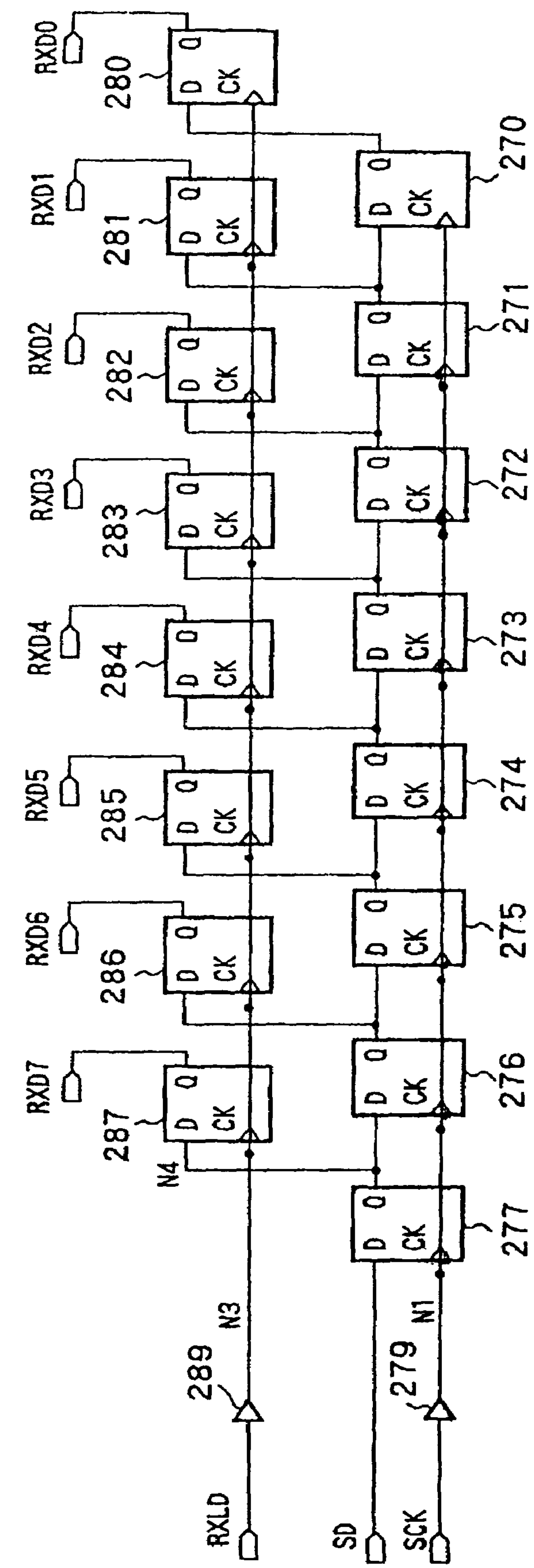
FIG. 6 is a circuit diagram of an embodiment of the S/P conversion circuit shown in FIG. 1.

FIG. 6 is a circuit diagram of an embodiment of the S/P conversion circuit shown in FIG. 1.

This S/P conversion circuit 260 includes buffers 279 and 289, and DFF 270 to 277 and 280 to 287.

The buffer 279 generates a clock signal N1 from the clock signal SCK, and outputs the signal to the clock inputs CK of eight DFF 270 to 277.

The buffer 289 generates a signal N3 from a load signal RXLD, and outputs the signal to the clock inputs CK of eight DFF 280 to 287.

DFF 270 to 277 are connected in series and form a shift register.

The transmitted data SD is input to the data input D of DFF 277, and is latched in the order of DFF 277 to 270 according to the clock signal N1.

The data input D of each of DFF 280 to 287 is input with the output data of a corresponding one of DFF 270 to 277.

DFF 280 to 287, which form a frame register and an output register, latch the output data of DFF 270 to 277 corresponding to the load signal N3, and convert the serial data in the transmitted data SD to parallel data RXD0 to 7.

In this way, the receiving circuit 200 in FIG. 1 receives the clock signal SCK transmitted from the transmitting circuit 100 by the signal line 101, and receives, by the signal line 105, the serial data SD transmitted from the transmitting circuit 200 after synchronizing with a falling edge of the clock signal SCK.

The reception control circuit 210 in the receiving circuit 200 generates a load signal RXLD when the value of the transmitted data SD from the signal line 105 changes twice or more in the interval from a rising edge of the clock signal SCK to its next rising edge.

the S/P conversion circuit 260 latches the serial data from the signal line 105 at each rising edge of the clock signal SCK, and converts the latched serial data into parallel data on the basis of the load signal RXLD.

Figure 7:
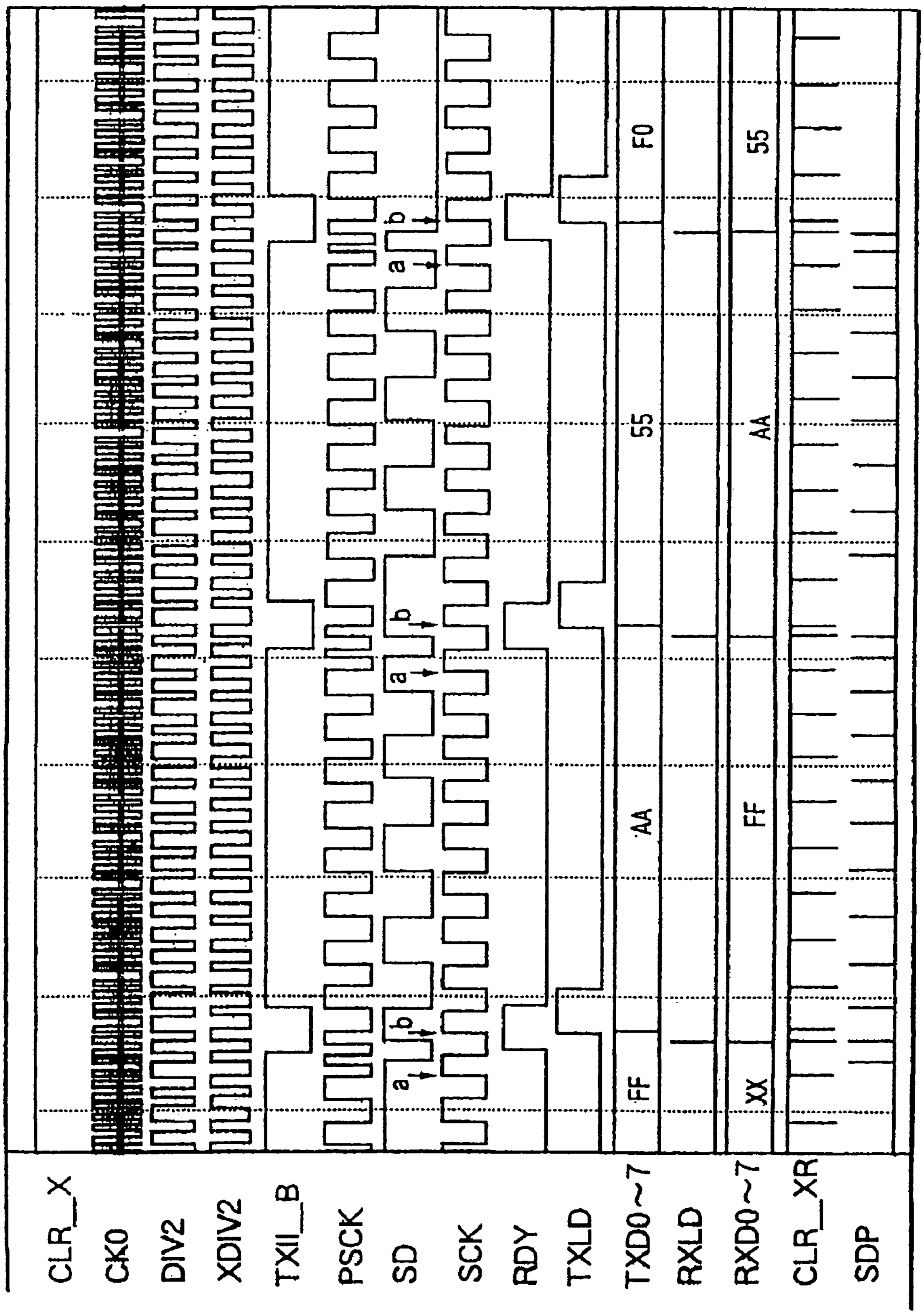
FIG. 7 is a time chart showing the operation of the transmission control circuit, P/S conversion circuit, reception control circuit and S/P conversion circuit shown in FIG. 1 and FIG. 3 to FIG. 6.

FIG. 7 is a time chart showing the operation of the transmission control circuit 110, P/S conversion circuit 160, reception control circuit 210 and S/P conversion circuit 260 shown in FIG. 3 to FIG. 6.

Second Embodiment

Figure 8:
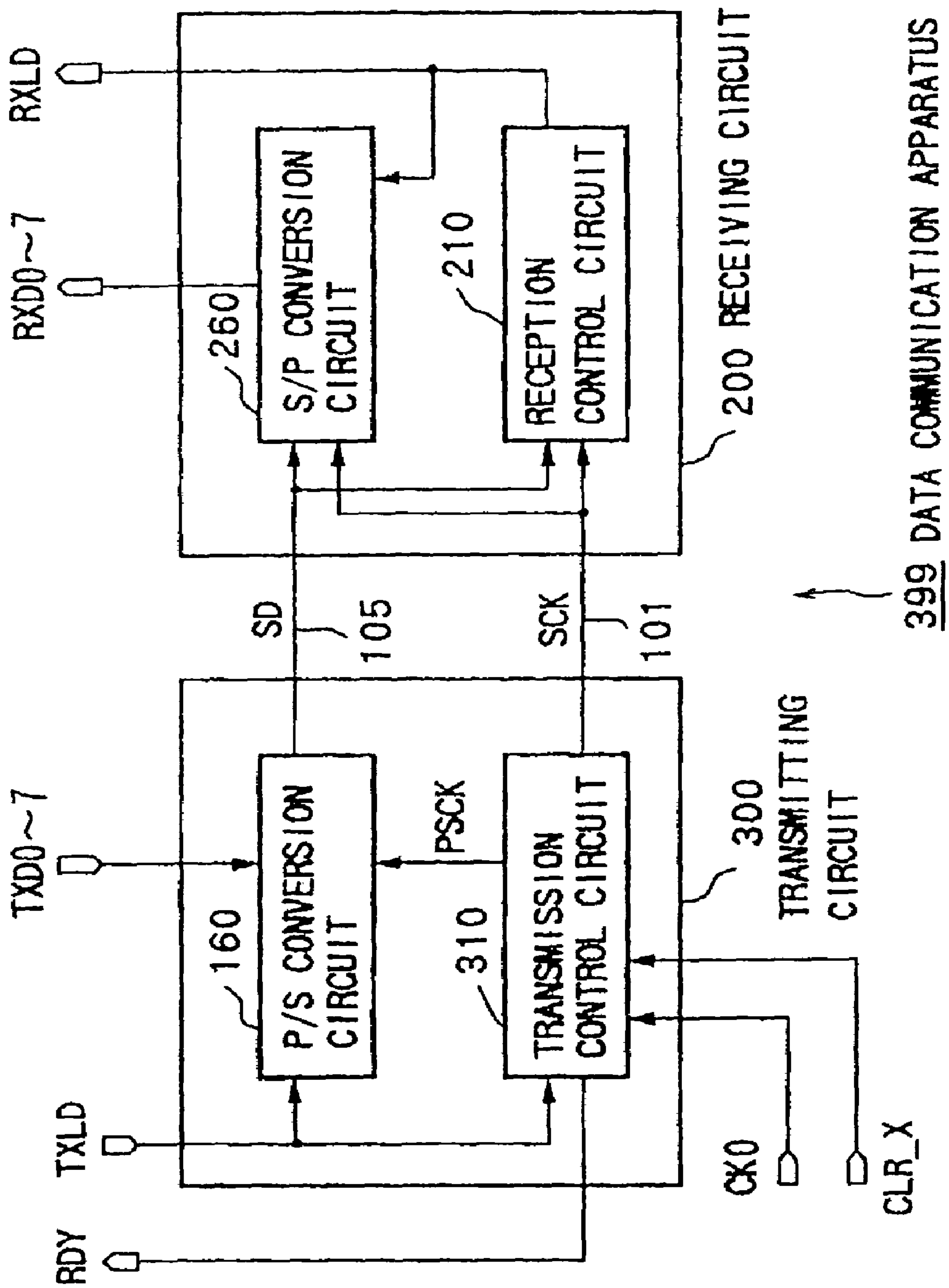
FIG. 8 is a schematic block diagram of a configuration of a data communication apparatus according to a second embodiment of the present invention.

FIG. 8 is a schematic block diagram of a configuration of a data communication apparatus according to a second embodiment of the present invention.

The data communication apparatus 399 comprises a transmitting circuit-300, a receiving circuit 200, and signal lines 101 and 105. Note that in the data communication circuit 399 in FIG. 8, the same reference numerals are assigned to blocks the same as in the data communication apparatus 299 of FIG. 1, and explanations of the same blocks are suitably omitted.

The transmitting circuit 300 comprises a transmission control circuit 310 and a P/S conversion circuit 160.

The transmission control circuit 310 is input with a load signal TXLD for P/S conversion, a reference clock signal CK0 and a reset signal CLR_X.

This transmission control circuit 310 generates a ready signal RDY. In addition, it generates a clock signal SCK for serial data transmission and outputs the signal to the receiving circuit 200, and generates a clock signal PSCK for P/S conversion and outputs the signal to the P/S conversion circuit 160.

Figure 9:
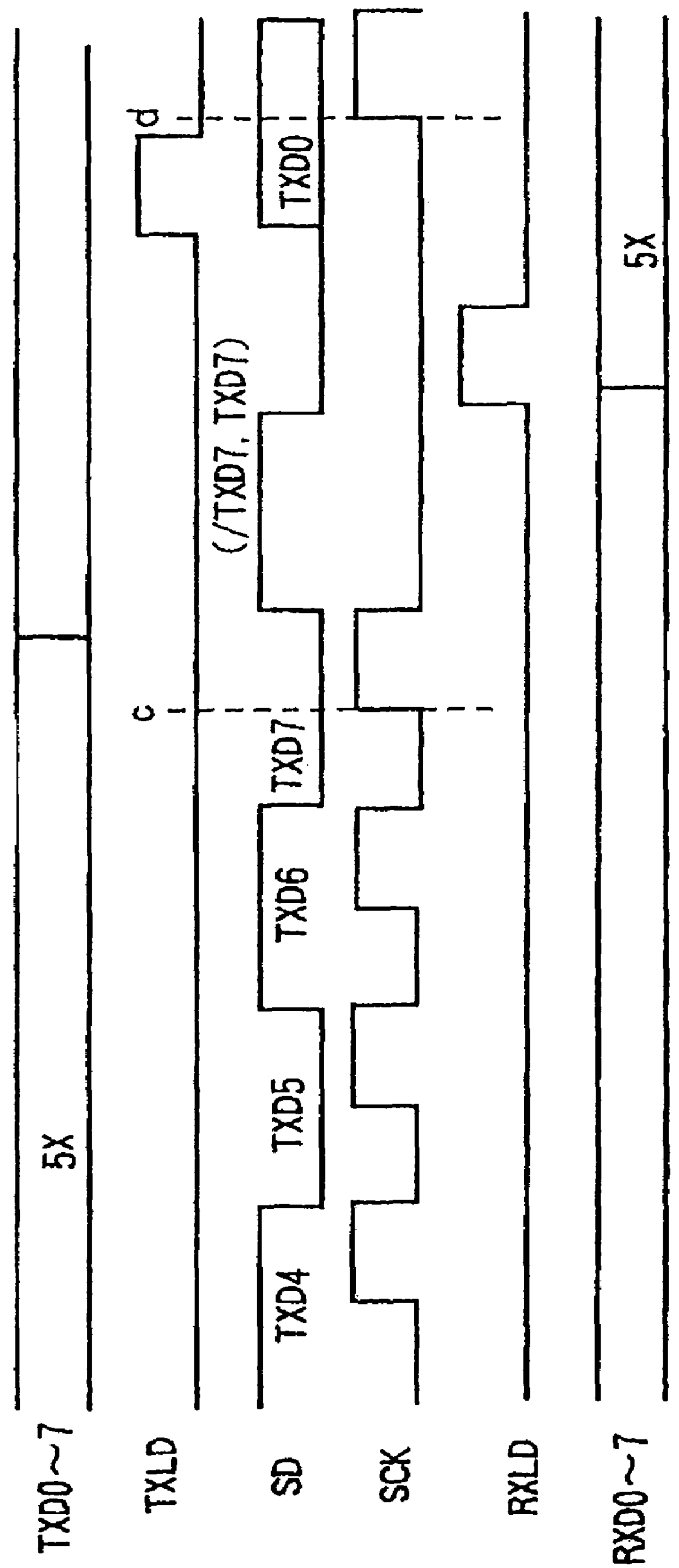
FIG. 9 is a schematic time chart of the data communication apparatus shown in FIG. 8.

FIG. 9 is a schematic time chart of the data communication apparatus 399 shown in FIG. 8.

This time chart shows that the last four bits (TXD 4 to 7) in the transmitted data corresponding to one frame are sent in series, and in the interval from c to d, frame synchronization data is transmitted, and the next frame transmission is started. In this example, the transmitted data SD is sent serially from the LSB side.

The transmitting circuit 300 in FIG. 8 synchronizes the serial data in the transmitted data SD with a falling edge of the clock signal SCK and sends the data to the receiving circuit 200.

When transmitting the frame synchronization data, the transmitting circuit 300 expands the interval between two clock signals SCK to make the period of the frame synchronization data (/TXD7 and TXD7) equal to that of the serial data.

As shown in the time chart of FIG. 9, when the frame synchronization data changes, what the transmitting circuit 300 does is to expand the intervals between signals in the time region from c to d.

The receiving circuit 200 synchronizes the serial data in the transmitted data SD with a rising edge of the clock signal SCK and stores the data in the shift register. In addition, in the interval between c and d, that is, from a rising edge to a next rising edge of the clock signal SCK, if the value of the transmitted data SD changes twice or more, this change is detected and this part is recognized as the frame synchronization data.

In FIG. 9, between the interval between c and d, the value of the transmitted data SD changes at least twice, so the reception control circuit 210 detects this change and designates this portion as the frame synchronization data.

Then, the reception control circuit 210 generates a load signal RXLD for S/P conversion. Based on the load signal RXLD, the S/P conversion circuit 260 moves data stored in the shift register to the frame register and generates parallel data RXD0 to 7, and restores the parallel data TXD0 to 7.

Figure 10:
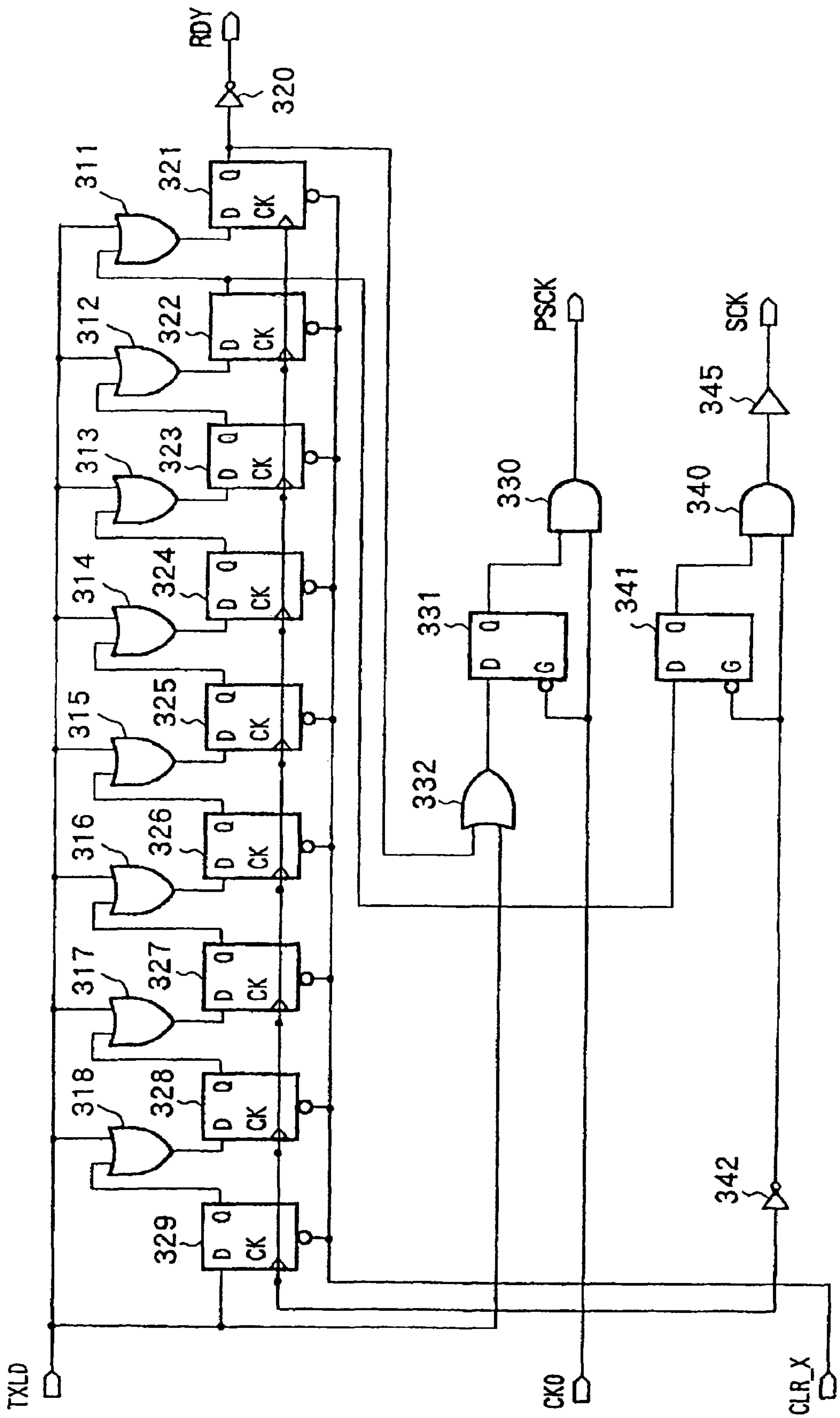
FIG. 10 is a circuit diagram of an embodiment of the transmission control circuit shown in FIG. 8.

FIG. 10 is a circuit diagram of an embodiment of the transmission control circuit in FIG. 8.

This transmission control circuit 310 includes logical sum circuits (OR circuit) 311 to 318 and 332, DFF 321 to 329, inversion circuits (NOT circuit) 320 and 342, a buffer 345, logical multiplication circuits (AND circuit) 330 and 340, and flip-flop (FF)331 and 341.

One of the inputs of each OR circuits 311 to 318 is input with an output signal of a corresponding DFF among DFF 321 to 329, while the other input is supplied with a load signal TXLD.

The data input D of each DFF 321 to 328 is input with an output signal from a corresponding one among the OR circuits 311 to 318. In addition, the data input D of DFF 329 is input with a load signal TXLD.

The clock inputs CK of DFF 321 to 329 are input with a clock signal CK0.

The reset terminals of DFF 321 to 329 are input with the reset signal CLR_X, and when the reset signal CLR_X is at low level, DFF 321 to 329 are reset.

The inversion circuit 320 inverts the output signal of the DFF 321 and generates a ready signal RDY.

The OR circuit 332 calculates the logical sum of the output signal of DFF 321 and the load signal TXLD, and outputs the result to FF 331.

The data input of FF 331 is input with the output signal of the OR circuit 332, and the gate G is input with the clock signal CK0.

When the gate G is at low level, from the output Q, FF 331 outputs the signal input to the data input D.

When the gate G changes from the low level to the high level, FF 331 latches the signal input to the data input D at the time of changing to the high level, and outputs the latched data from the output Q until the gate G changes to the low level again. That is, the output signal of FF 331 does not change when the clock signal CK0 is at high level.

The AND circuit 330 calculates the logical multiplication of the output signal of FF 331 and the clock signal CK0, and outputs the result as the clock signal PSCK.

When the clock signal CK0 is at low level, the AND circuit 330 generates a low level clock signal PSCK.

Providing the FF 331 between the OR circuit 332 and AND circuit 330 prevents the output signal PSCK of the AND circuit 330 from changing from the high level to the low level of when the clock signal CK0 is at high level.

The inversion circuit 342 generates an inverted signal of the clock signal CK0, and inputs the signal to FF 341 and AND circuit 340.

The data input D of FF 341 is input with the output signal of the DFF 322, and the gate G is input with an output signal of the inversion circuit 342.

The AND circuit 340 calculates the logical multiplication of the output signal of FF 341 and the output of the inversion circuit 342, and outputs the result to the buffer 345.

Provision of FF 341 prevents the output signal of the AND circuit 340 from changing from the high level to the low level when the output signal of the inversion circuit 342 is at high level.

The buffer 345 generates a clock signal SCK for serial data transmission from the output signal of the AND circuit 340.

In the transmission control circuit 310 in FIG. 10, as a result of calculation of the logical multiplication of the output signal of DFF 322 and the inverted signal of the clock signal CK0, when the P/S conversion circuit alters the transmitted data SD to generate the frame synchronization data, the edge interval of the clock signal SCK is extended and the pulse is thinned.

The edge interval of the clock signal SCK is extended by the transmission control circuit 310 during transmission of the frame synchronization data, and exceeds the edge interval of the clock signal SCK during transmission of serial data.

In this way, the transmitting circuit 300 in FIG. 8 sends the clock signal SCK to the receiving circuit 200 by the signal line 101, and sends the serial data to the receiving circuit 200 by the signal line 105.

The P/S conversion circuit 160 in the transmitting circuit 300 converts the parallel data TXD0 to 7 for one frame to serial data, synchronizes the serial data with a falling edge of the clock signal SCK and transmits it. Following the transmission of the serial data, the P/S conversion circuit 160 transmits the frame synchronization data whose value changes N times (N is an integer not less than 2) in the interval from a rising edge to a next rising edge of the clock signal SCK.

Figure 11:
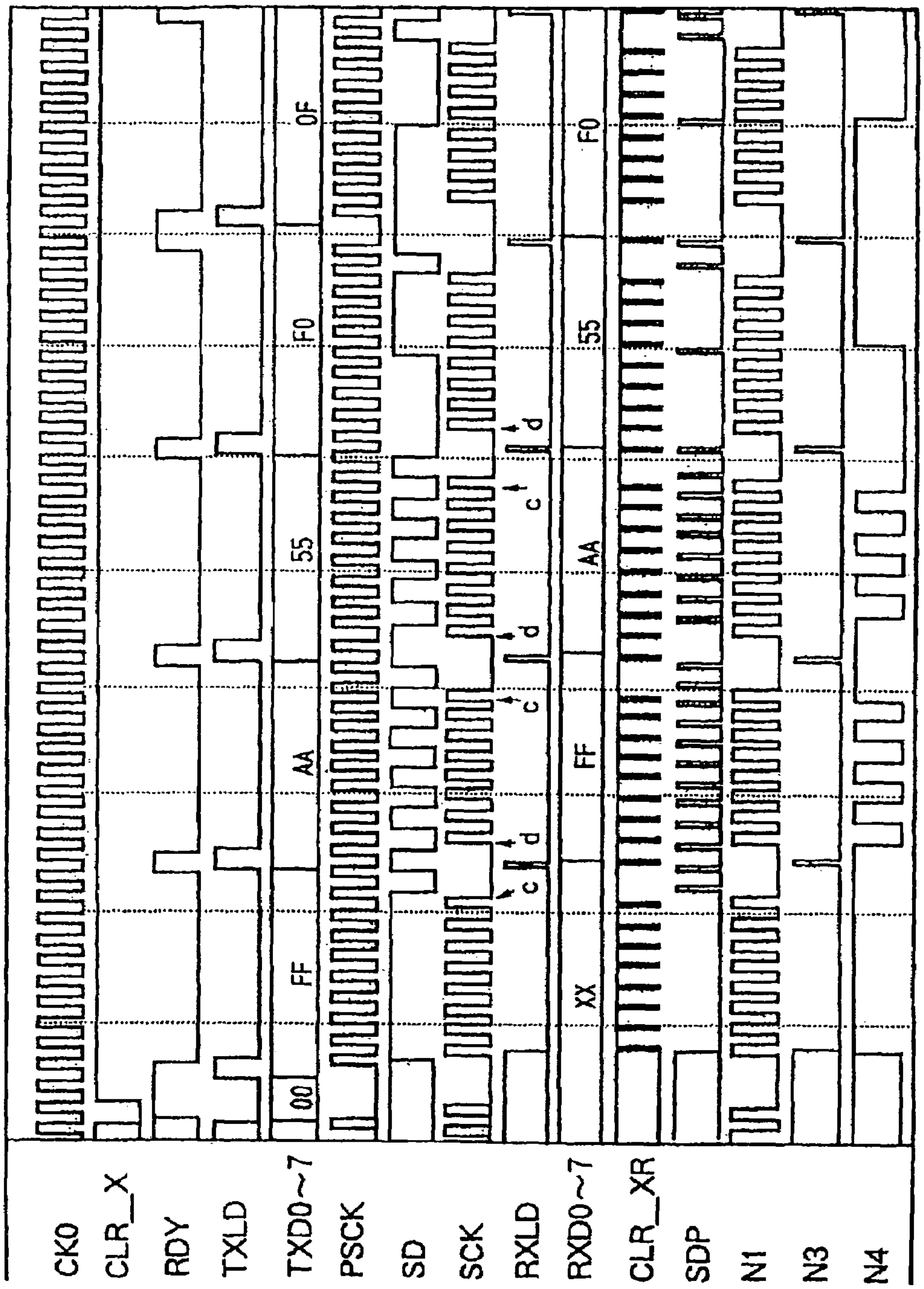
FIG. 11 is a time chart showing the operation of the transmission control circuit, P/S conversion circuit, reception control circuit and S/P conversion circuit shown in FIG. 8 and FIG. 10.

FIG. 11 is a time chart showing the operation of the transmission control circuit 310, P/S conversion circuit 160, reception control circuit 210 and S/P conversion circuit 260 shown in FIG. 8 and FIG. 10.

Third Embodiment

Figure 12:
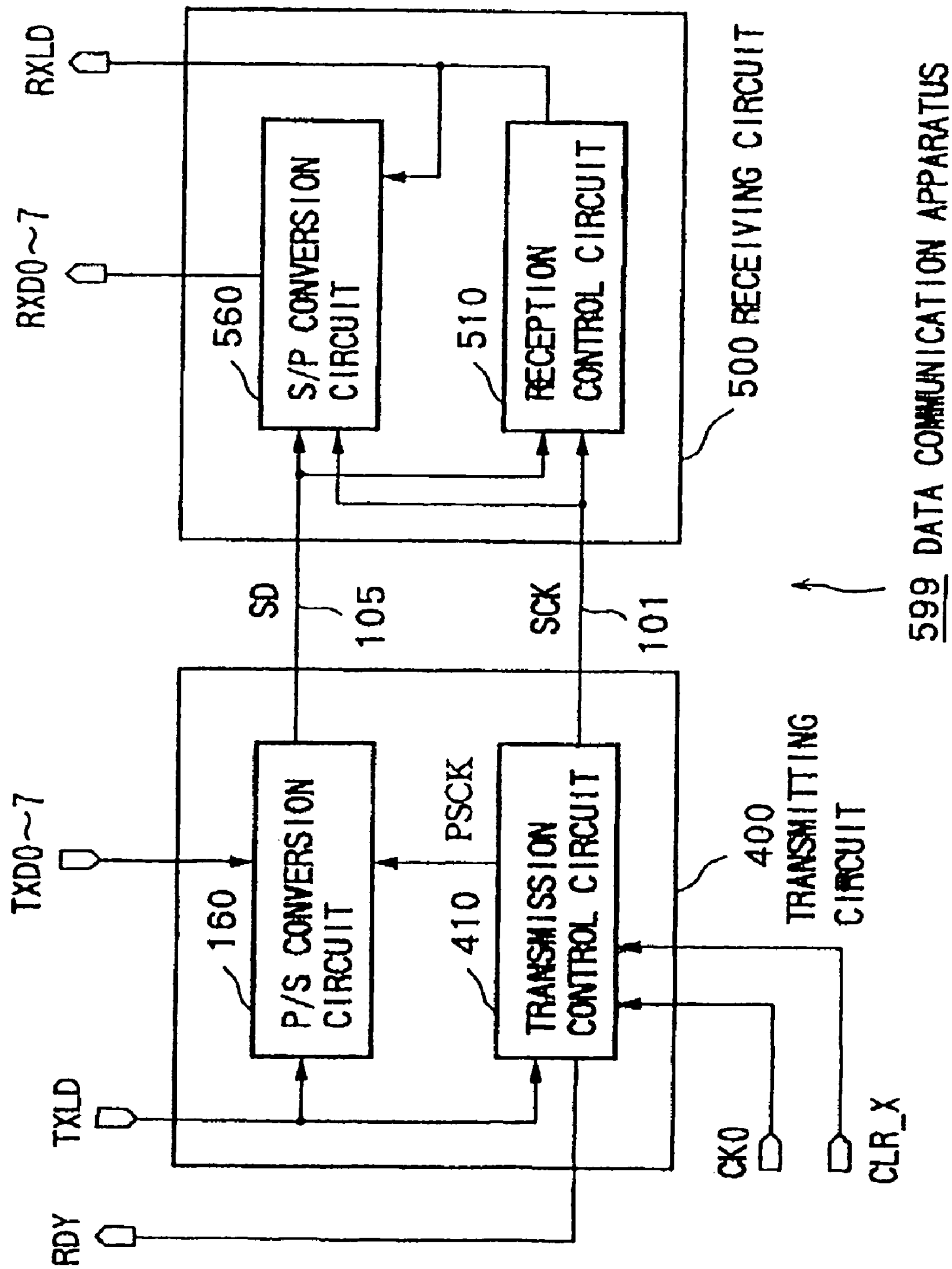
FIG. 12 is a schematic block diagram of a configuration of a data communication apparatus according to a third embodiment of the present invention.

FIG. 12 is a schematic block diagram of a configuration of a data communication apparatus according to a third embodiment of the present invention.

The data communication apparatus 599 comprises a transmitting circuit 400, a receiving circuit 500, and signal lines 101 and 105. Note that in the data communication circuit 599 in FIG. 12, the same reference numerals are assigned to blocks the same as in the data communication apparatus 299 of FIG. 1, and explanations of these same blocks are suitably omitted.

The transmitting circuit 400 comprises a transmission control circuit 410 and a P/S conversion circuit 160.

The transmission control circuit 410 is input with a load signal TXLD for P/S conversion, a reference clock signal CK0 and a reset signal CLR_X.

This transmission control circuit 410 generates a ready signal RDY. In addition, it generates a clock signal SCK for serial data transmission and outputs the signal to the receiving circuit 500 through the signal line 101, and generates a clock signal PSCK for P/S conversion and outputs the signal to the P/S conversion circuit 160.

The P/S conversion circuit 160 is input with parallel data TXD0 to 7, the load signal TXLD for P/S conversion, and the clock signal PSCK for P/S conversion.

This P/S conversion circuit 160 converts the parallel data TXD0 to 7 to serial data and sends the data to the receiving circuit 500 through the signal line 105.

The receiving circuit 500 comprises a reception control circuit 510 and a S/P conversion circuit 560.

The reception control circuit 510 is input with transmitted data SD from the signal line 105, and a clock signal SCK for serial data transmission from the signal line 101.

This reception control circuit 510 generates a load signal RXLD for S/P conversion and outputs the signal to the S/P conversion circuit 560.

The S/P conversion circuit 560 is input with the transmitted data SD, a clock signal SCK for serial data transmission, and a load signal RXLD for S/P conversion.

The S/P conversion circuit 560 converts the serial data in the transmitted data SD into parallel data RXD0 to 7.

Figure 13:
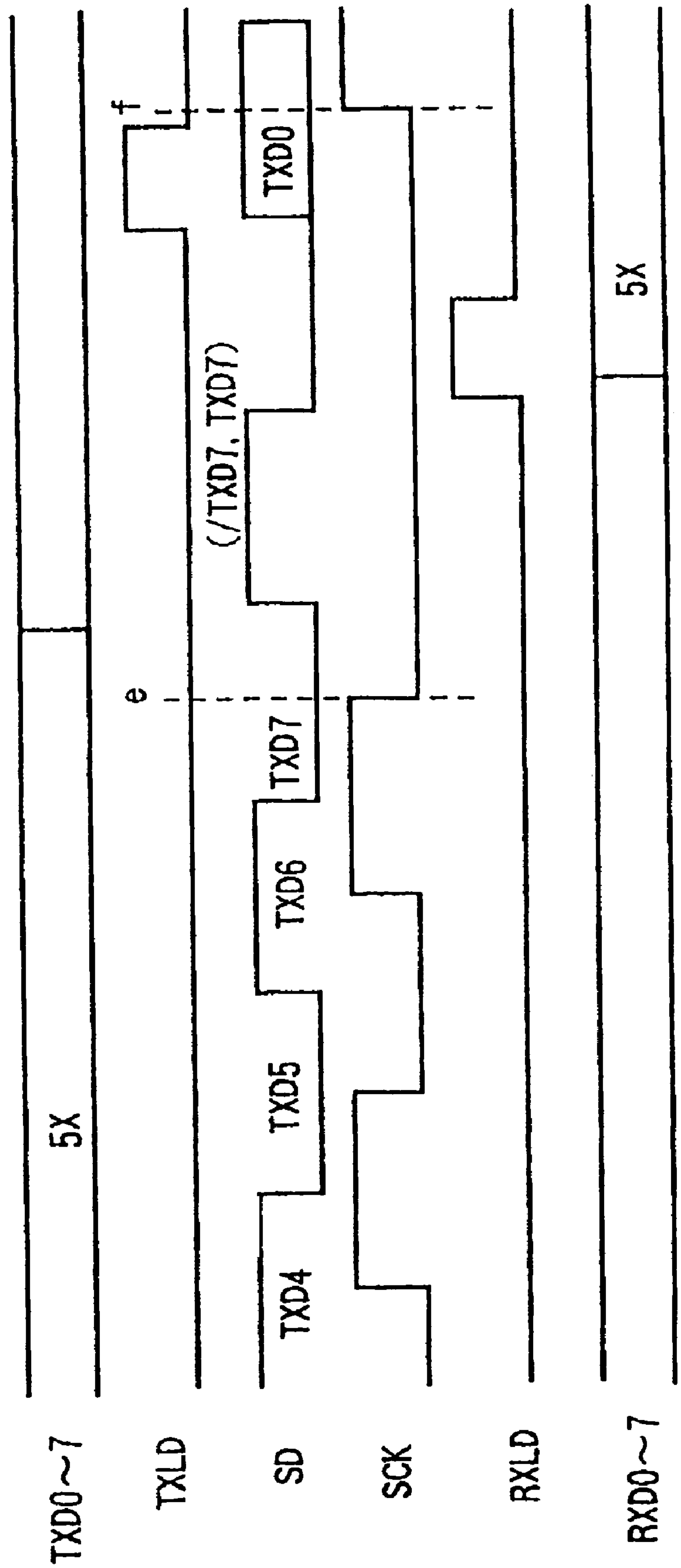
FIG. 13 is a schematic time chart of the data communication apparatus shown in FIG. 12.

FIG. 13 is a schematic time chart of the data communication apparatus 599 shown in FIG. 12.

This time chart shows that the last four bits (TXD 4 to 7) in the transmitted data corresponding to one frame are sent in series, and in the interval from e to f, frame synchronization data (/TXD7 and TXD7) are transmitted to start the next frame transmission. In this example, the transmitted data SD is transmitted serially from the LSB side.

The transmitting circuit 400 transmits serial data to the receiving circuit 500 in synchronism with the edges of the clock signal SCK.

When transmitting the frame synchronization data, the transmitting circuit 400 extends the edge interval of the clock signal SCK to thin the clock pulse in the interval between e and f, and thereby a larger number of changes of the serial data are included in the interval from a falling edge to a rising edge of the clock signal SCK, and therefore this data can be defined as the frame synchronization data.

In synchronism with edges of the clock signal SCK, the receiving circuit 500 stores the serial data in the transmitted data SD in a shift register. In addition, in the interval from a rising edge to a next falling edge, or from a falling edge to a next rising edge, of the clock signal SCK, if the value of the transmitted data SD changes twice or more, this change is detected and this portion of signal is recognized as the frame synchronization data.

In FIG. 13, in the interval between e and f, the value of the transmitted data SD changes at least twice, so the reception control circuit 510 detects this change recognizes this portion as the frame synchronization data.

Then, the reception control circuit 510 generates a load signal RXLD for S/P conversion. Based on the load signal RXLD, the S/P conversion circuit 560 moves data stored in the shift register to the frame register and generates parallel data RXD0 to 7 to restore the parallel data TXD0 to 7.

Figure 14:
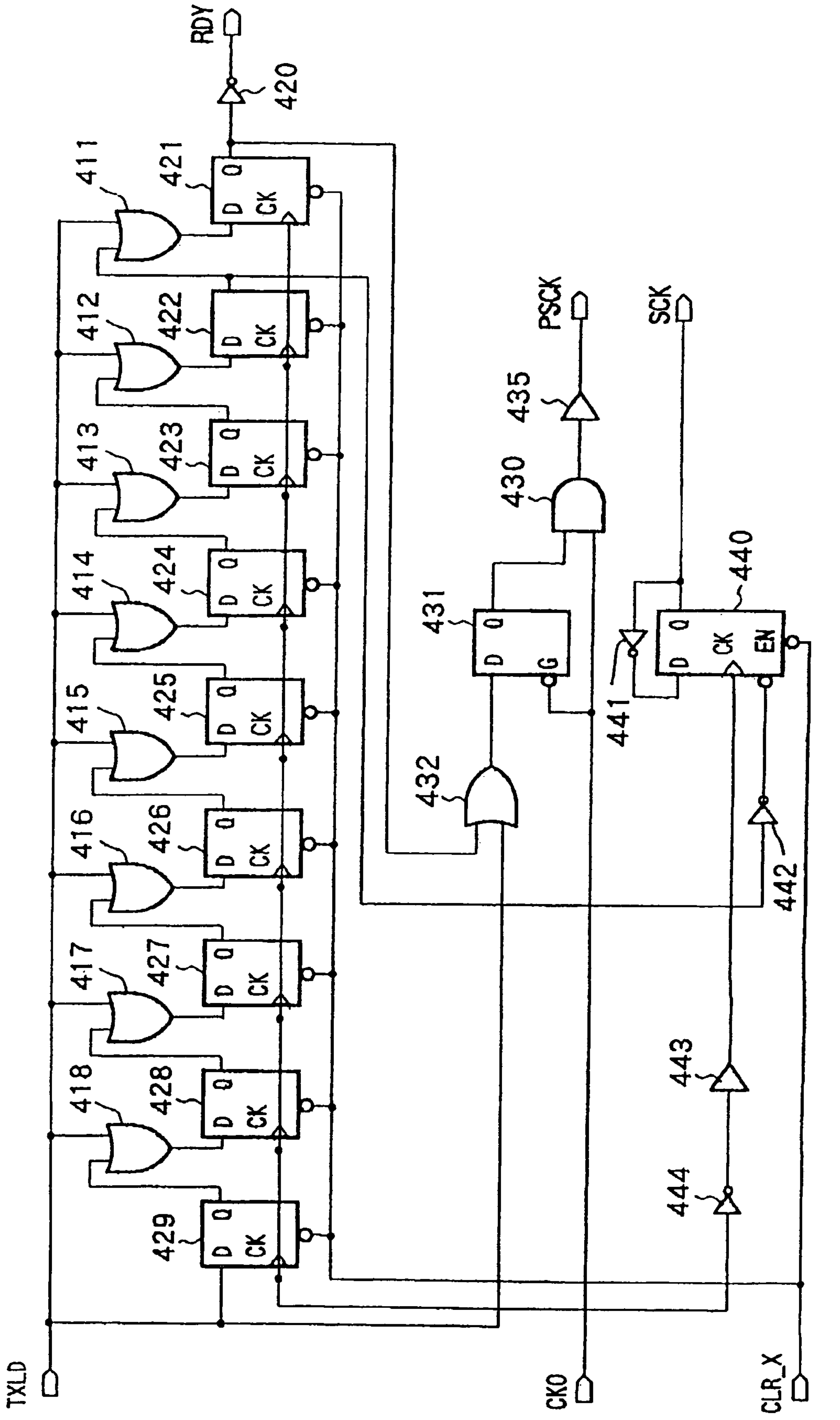
FIG. 14 is a circuit diagram of an embodiment of the transmission control circuit shown in FIG. 12.

FIG. 14 is a circuit diagram of an embodiment of the transmission control circuit in FIG. 12.

This transmission control circuit 410 includes logical sum circuits (OR circuit) 411 to 418 and 432, DFF 421 to 429, inversion circuits (NOT circuit) 441, 442, and 444, buffers 435 and 443, a logical multiplication circuit (AND circuit) 430, and DFF 440.

One of the inputs of each OR circuit among OR circuits 411 to 418 is input with an output signal of a corresponding DFF of DFF 422 to 429, while the other input is input with a load signal TXLD.

The data input D of each DFF 421 to 428 is input with an output signal from a corresponding one of the OR circuits 411 to 418. In addition, the data input D of DFF 429 is input with a load signal TXLD.

The clock inputs CK of DFF 421 to 429 are input with a clock signal CK0.

The reset terminal of DFF 421 to 429 and 440 is input with the reset signal CLR_X, and when the reset signal CLR_X is at low level, DFF 421 to 429 and 440 are reset.

The inversion circuit 420 inverts the output signal of the DFF 421 and generates a ready signal RDY.

The OR circuit 432 calculates the logical sum of the output signal of DFF 421 and the load signal TXLD, and outputs the result to FF 431.

The data input of FF 431 is input with the output signal of the OR circuit 432, and the gate G is input with the clock signal CK0.

When the gate G is at low level, FF 431 outputs the signal (data) input to the data input D from the output Q.

When the gate G changes from the low level to the high level, FF 431 latches the signal input to the data input D at the time of changing to the high level, and outputs the latched data from the output Q until the gate G changes to the low level again. That is, the output signal of FF 431 does not change when the clock signal CK0 is at high level.

The AND circuit 430 calculates the logical multiplication of the output signal of FF 431 and the clock signal CK0, and outputs the result to the buffer 435. The buffer 435 generates a clock signal PSCK from the output signal of the AND circuit 430.

When the clock signal CK0 is at low level, the AND circuit 430 generates a low level clock signal PSCK.

Providing FF 431 between the OR circuit 432 and the AND circuit 430 prevents the output signal of the AND circuit 430 from changing from high level to low level, when the clock signal CK0 is at high level.

The inversion circuit 444 generates an inverted signal of the clock signal CK0, and outputs the signal to the buffer 443. The buffer 443 outputs the output signal of the inversion circuit 444 to the clock input CK of DFF 440.

The inversion circuit 442 inverts the output signal of DFF 422, and outputs the signal to the enable terminal EN of DFF 440. DFF 440 operates when the enable terminal EN is at low level, and locks the output Q to low level when the enable terminal is at high level.

The inversion circuit 441 inverted the output signal SCK of DFF 440 and inputs the signal to the input D of DFF 440.

DFF 440 latches the output signal of the inversion circuit 441 on the basis of the output signal of the buffer 443, and outputs the clock signal SCK for serial data transmission from the output Q.

The DFF 440 and inversion circuit 441 form a dividing circuit, which generates a signal SCK of a period twice that of the signal CK0 when the enable terminal is input a low level signal.

In the transmission control circuit 410 in FIG. 14, as a result of using the (inverted signal of) output signal of DFF 440 for an enable signal of DFF 440, the edge interval of the clock signal SCK is extended and the pulse is thinned when the P/S conversion circuit 160 alters the transmitted data SD and generates frame synchronization data.

The transmission control circuit 410 extends the edge interval of the clock signal SCK during transmission of the frame synchronization data, even exceeding the edge interval of the clock signal SCK during transmission of serial data.

Figure 15:
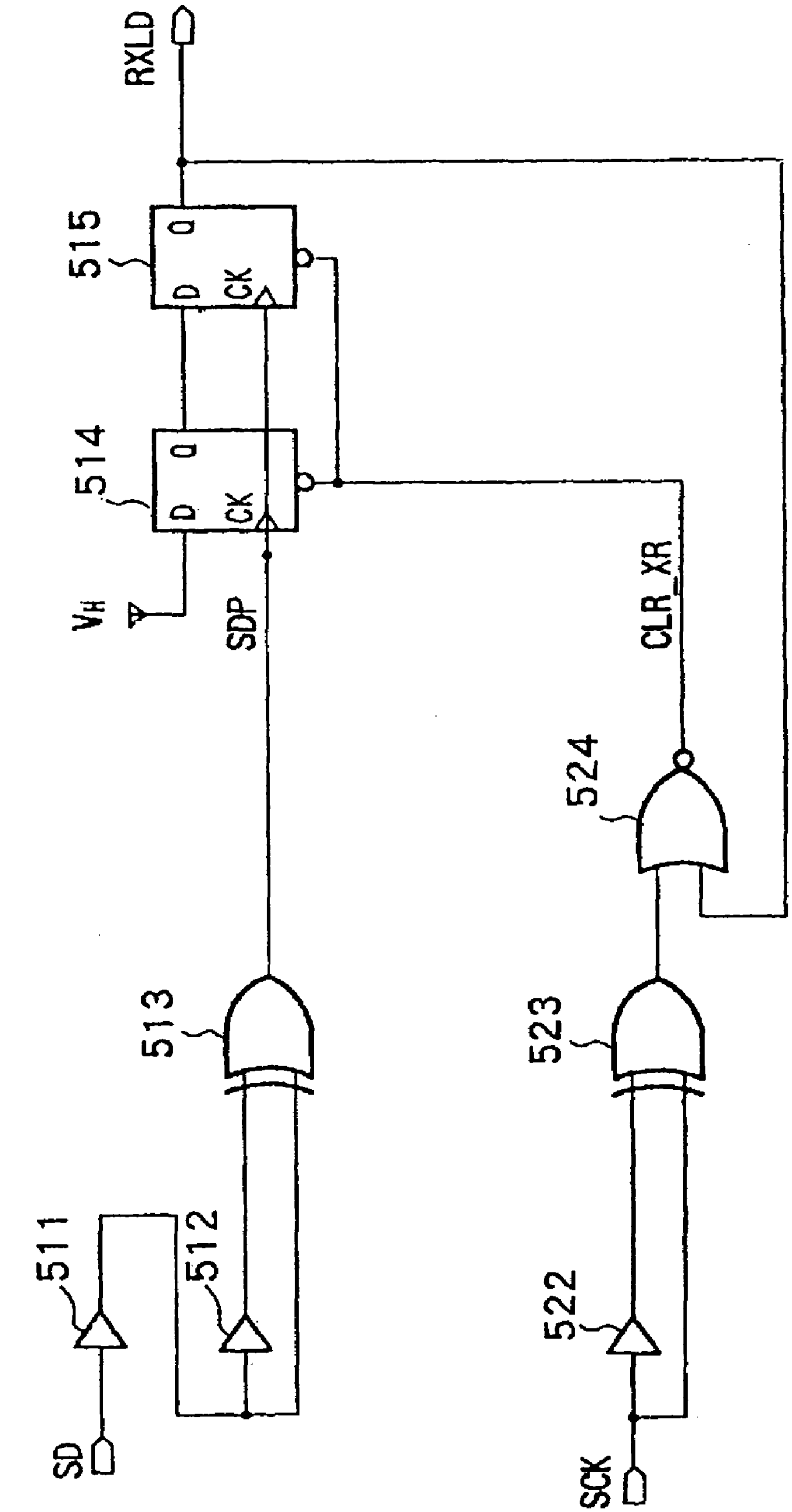
FIG. 15 is a circuit diagram of an embodiment of the reception control circuit shown in FIG. 12.

FIG. 15 is a circuit diagram of an embodiment of the reception control circuit shown in FIG. 12.

The reception control circuit 510 includes buffers 511, 512 and 522, exclusive logical sum circuits (EOR circuit) 513 and 523, a logical sum circuit 524, and DFF 514 and 515.

The buffer 511 outputs the transmitted data SD from the signal line 105 to the buffer 512 and EOR circuit 513.

The EOR circuit 513 calculates the exclusive logical sum of the output signals of the buffer 512 and 511, and outputs a signal (data pulse) SDP representing the calculation result to the clock input CK of DFF 514 and 515.

The buffer 512 and the EOR circuit 513 form a detection circuit for detecting the change of the value of the transmitted data SD.

The buffer 522 outputs the clock signal SCK from the signal line 101 to the EOR circuit 523.

The EOR circuit 523 calculates the exclusive logical sum of the output signal of the buffer 522 and clock signal SCK, and outputs the result to the OR circuit 524.

The buffer 522 and the EOR circuit 523 form an edge detection circuit for detecting the rising and falling edges of the clock signal SCK.

The OR circuit 524 calculates the logical sum of the output signal of the EOR circuit 523 and the load signal RXLD, generates a signal CLR_XR representing the negation of the calculation result, and outputs the signal to the reset terminals of DFF 514 and 515.

The data input D of DFF 514 is locked to a high level supplied by the voltage VH of the power supply.

The data input D of DFF 515 is input with an output signal of DFF 514. DFF 515 outputs a load signal RXLD from the output Q.

DFF 514 and 515 are reset at each rising or falling edge of the clock signal SCK.

DFF 515 generates a high level load signal RXLD when the signal SDP becomes the high level twice or more (namely, the transmitted data changes twice or more) in the interval from an edge of the clock signal SCK to its next edge.

Figure 16:
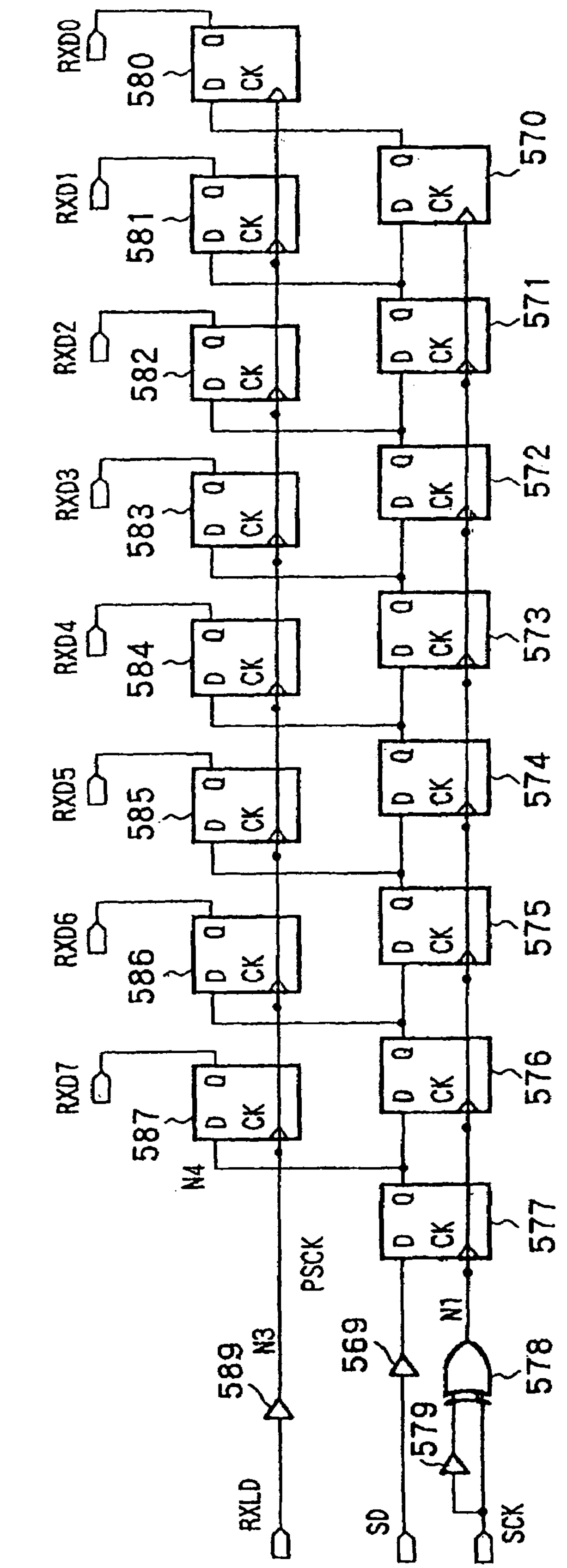
FIG. 16 is a circuit diagram of an embodiment of the S/P conversion circuit shown in FIG. 12.

FIG. 16 is a circuit diagram of an embodiment of the S/P conversion circuit shown in FIG. 12.

This S/P conversion circuit 560 includes buffers 569, 579 and 589, an exclusive logical sum circuit (EOR circuit) 578, and DFF 570 to 577 and 580 to 587.

The buffer 589 generate a signal N3 from a load signal RXLD, and outputs the signal N3 to the clock inputs CK of DFF 580 to 587.

The buffer 569 outputs the transmitted data SD to the data input D of DFF 577.

The buffer 579 outputs the clock signal SCK to the EOR circuit 578.

The EOR circuit 578 calculates the exclusive logical sum of the output signal of the buffer 579 and clock signal SCK, generates a signal N1 representing the calculation result, and outputs the signal N1 to the clock inputs CK of DFF 570 to 577.

The EOR circuit 578 and the buffer 579 form an edge detection circuit for detecting edges of the clock signal SCK and outputting a pulse at each edge of the clock signal SCK.

DFF 570 to 577 are connected in series and form a shift register.

The data input D of DFF 577 is input with the transmitted data SD through the buffer 569, and the serial data in the transmitted data SD is latched in the order of DFF 577 to 570 in synchronism with the clock signal N1.

The data input D of each of DFF 580 to 587 is input with the output data of the corresponding DFF among DFF 570 to 577.

DFF 580 to 587, which form a frame register and an output register, latch the output data of DFF 570 to 577 according to the load signal N3, and convert the serial data in the transmitted data SD into parallel data RXD0 to 7.

In this way, the receiving circuit 500 in FIG. 12 receives the clock signal SCK transmitted from the transmitting circuit 400 by the signal line 101, and receives the serial data SD transmitted from the transmitting circuit 400 after synchronizing with edges of the clock signal SCK by the signal line 105.

The reception control circuit 510 in the receiving circuit 500 generates a load signal RXLD when the value of the transmitted data SD from the signal line 105 changes twice or more in the interval from a rising edge to a next falling edge, or from a falling edge to a next rising edge, of the clock signal SCK.

The S/P conversion circuit 560 latches the serial data from the signal line 105 in order at each edge of the clock signal SCK, and converts the latched serial data into parallel data on the basis of the load signal RXLD.

Figure 17:
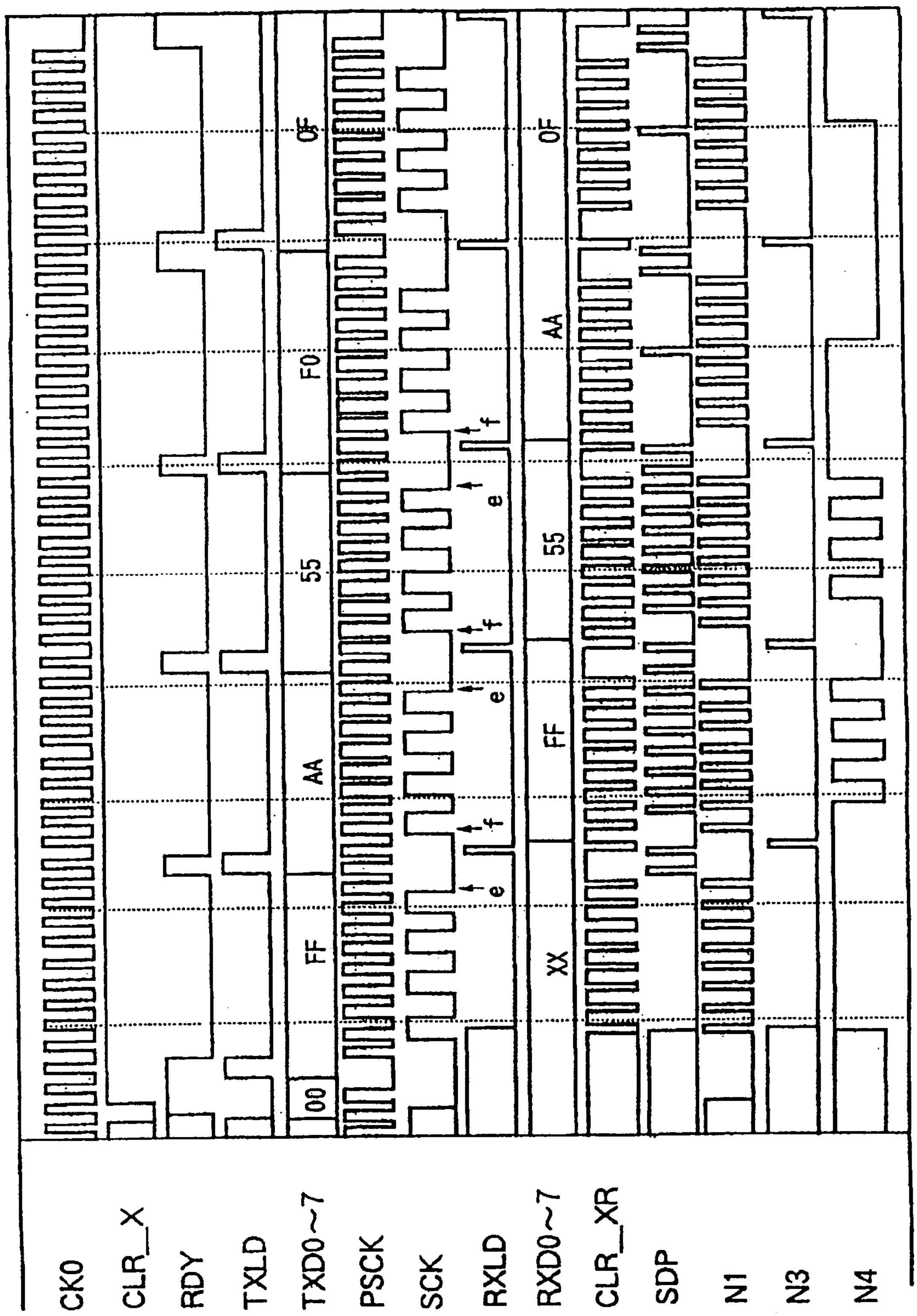
FIG. 17 is a time chart showing the operation of the transmission control circuit, P/S conversion circuit, reception control circuit and S/P conversion circuit shown in FIG. 12 and FIG. 14 to FIG. 16.

FIG. 17 is a time chart showing the operation of the transmission control circuit 410, P/S conversion circuit 460, reception control circuit 510 and S/P conversion circuit 560 shown in FIG. 12 and FIG. 14 to FIG. 16.

Fourth Embodiment

In the above first to third embodiments, descriptions are made by taking as an example a case where a single signal line 105 was used for serial data transmission. However, a number of signal lines may also be used to transmit serial data in parallel.

In this case, in one of the above signal lines, the frame synchronization data is identified by detecting two or more changes of the transmitted data SD in an interval from an edge to a next edge of the clock signal SCK.

Further, in the rest signal lines, by detecting two or more changes of the transmitted data SD in the same interval, it is possible to transmit additional data to the frame synchronization data; The additional data may include parity data for checking errors in data and check sum data, and so on.

Figure 18:
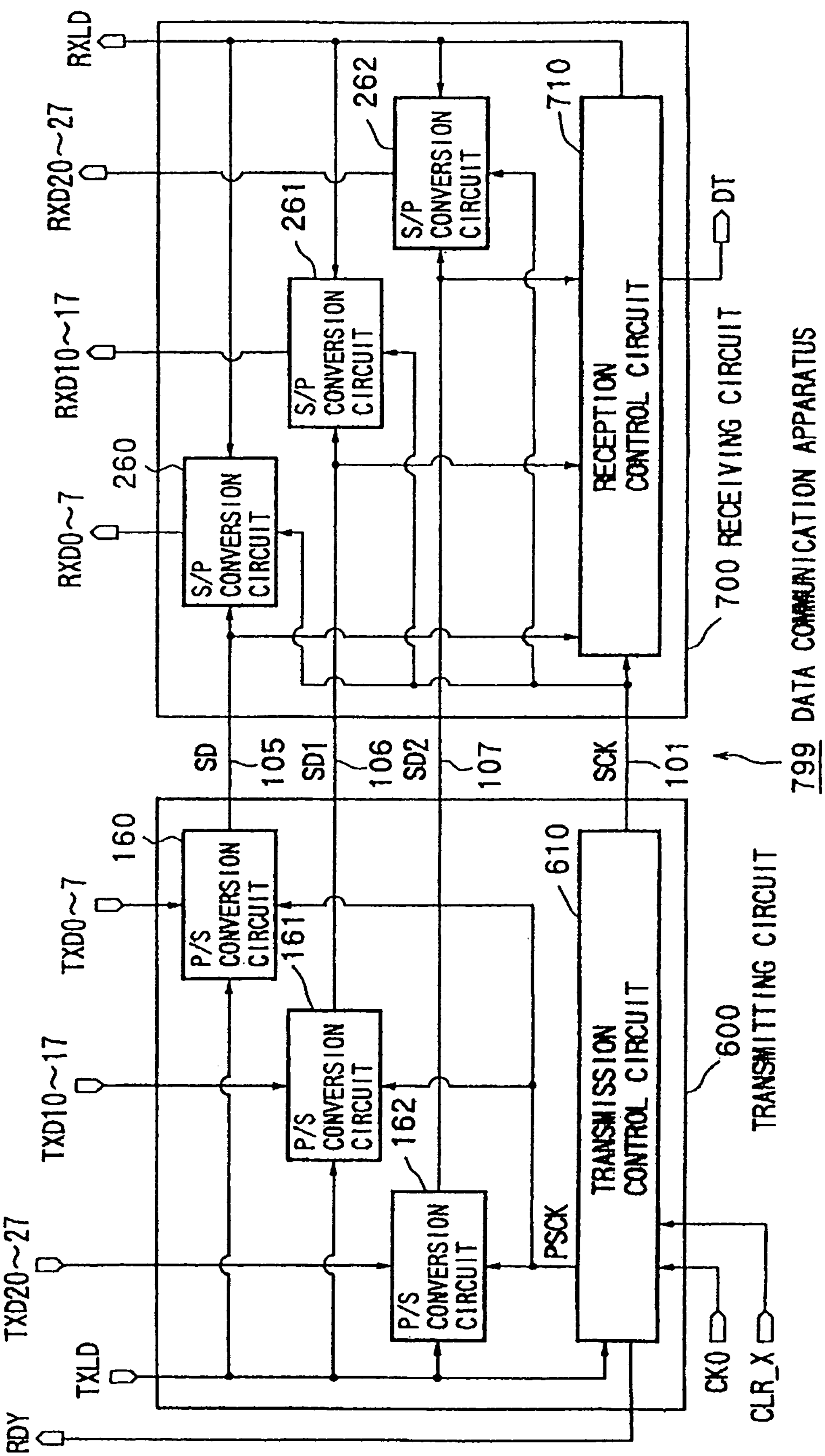
FIG. 18 is a schematic block diagram of a configuration of a data communication apparatus according to a fourth embodiment of the present invention.

FIG. 18 is a schematic block diagram of a configuration of a data communication apparatus according to a fourth embodiment of the present invention.

The data communication apparatus 799 comprises a transmitting circuit 600, a receiving circuit 700, and signal lines 101 and 105 to 107. The transmitting circuit 600 and receiving circuit 700 are connected by the signal lines 101 and 105 to 107.

The transmitting circuit 600 comprises a transmission control circuit 610 and P/S conversion circuits 160 to 162.

The transmission control circuit 610 is input with a load signal TXLD for P/S conversion, a reference clock signal CK0 and a reset signal CLR_X.

This transmission control circuit 610 generates a ready signal RDY. In addition, it generates a clock signal SCK for serial data transmission and outputs the signal to the receiving circuit 700 through the signal line 101, and generates a clock signal PSCK for P/S conversion and outputs the signal to the P/S conversion circuits 160 to 162.

The P/S conversion circuit 160 is input with parallel data TXD0 to 7, the load signal TXLD for P/S conversion, and the clock signal PSCK.

This P/S conversion circuit 160 converts the parallel data TXD0 to 7 to serial data and outputs the data to the receiving circuit 700 through the signal line 105.

The P/S conversion circuit 161 is input with parallel data TXD10 to 17, the load signal TXLD for P/S conversion, and the clock signal PSCK.

This P/S conversion circuit 161 converts the parallel data TXD10 to 17 to serial data and outputs the data to the receiving circuit 700 through the signal line 106.

The P/S conversion circuit 162 is input with parallel data TXD20 to 27, the load signal TXLD for P/S conversion, and the clock signal PSCK.

This P/S conversion circuit 162 converts the parallel data TXD20 to 27 to serial data and outputs the data to the receiving circuit 700 through the signal line 107.

The transmission control circuit 610 has the functions of the transmission control circuit 110, and further has the function of controlling the P/S conversion circuits 160 to 162 so that frame synchronization data is transmitted through the signal line 105 of the signal lines 105 to 107 while selectively transmitted through the rest signal lines 106 and 107.

For example, the P/S conversion circuits 161 and 162 each have similar configuration as the P/S conversion circuit 160, and the transmission control circuit 610 can replace the data input to the input B of the select circuit 178 in the P/S conversion circuit 160 with either data TXD7 or the inverted data/TXD7.

Through the signal line 101, the clock signal SCK is transmitted from the transmitting circuit 600 to the receiving circuit 700.

Through the signal line 105 to 107, the serial data is transmitted from the transmitting circuit 600 to the receiving circuit 700 in synchronism with the clock signal SCK. Each of signal lines 105 to 107 forms a serial transmission channel. Note that the differences of the lengths of the signal lines 101 and 105 to 107, namely, differences of transmission time-delays are desirably negligible in comparison with the pulse width of the clock signal SCK.

The receiving circuit 700 comprises a reception control circuit 710 and S/P conversion circuits 260 to 262 which have the same configuration.

The reception control circuit 710 is input with the transmitted data SD, SD1 and SD2 including serial data and frame synchronization data, and a clock signal SCK for serial data transmission.

The reception control circuit 710 has the functions of the reception control circuit 210, and further has functions of generating a load signal RXLD to supply the S/P conversion circuits 260 to 262, detecting frame synchronization data of the signal lines 105 to 107 and outputting additional data DT.

For example, when the transmitted data SD from the signal line 105 changes twice or more in the aforesaid interval from a to b, the reception control circuit 710 detects if the data SD1 and SD2 from signal lines 106 and 107 change twice or more in the same interval, and based on the detection result, additional data DT is output.

The S/P conversion circuit 260 is input with a clock signal SCK, a load signal RXLD, and the transmitted data SD including serial data and frame synchronization data from the P/S conversion circuit 160.

The S/P conversion circuit 260 converts the serial data in the transmitted data SD into parallel data RXD0 to 7.

The S/P conversion circuit 261 is input with the clock signal SCK, load signal RXLD, and the transmitted data SD1 including serial data and frame synchronization data from the P/S conversion circuit 161.

The S/P conversion circuit 261 converts the serial data in the transmitted data SD1 into parallel data RXD10 to 17.

The S/P conversion circuit 262 is input with the clock signal SCK, load signal RXLD, and the transmitted data SD2 including serial data and frame synchronization data from the P/S conversion circuit 162.

The S/P conversion circuit 262 converts the serial data in the transmitted data SD2 into parallel data RXD20 to 27.

The data communication apparatus 799 shown in FIG. 18 employs the configuration of the data communication apparatus 299 shown in FIG. 1, but it may also employ the configuration of the apparatus 399 shown in FIG. 8, or the apparatus 299 shown in FIG. 12.

In the above embodiments, one frame consists of eight bits, resulting in a simple configuration, but it can be easily expanded to other bit lengths.

Further, in large scale integrated circuits (LSI) fabricated at 0.25 $\mu$m process rule, the serial data transmission rate can reach 1 Gbit/sec per signal transmission line.

As described above, in data communication apparatuses 299, 399, 599 and 799, frame synchronization in serial data transmission can be carried out using simple circuits, furthermore, in a shorter time.

In data communication apparatus 399, the transmitted data used as frame synchronization data can have a variation period the same as or shorter than the variation period of data during serial data transmission, so the data transmission rate can be raised, and the frequency bandwidth of a signal line can be effectively utilized.

In the data communication apparatus 599, the transmission rate can be raised twice as much as that of the data communication apparatus 299 at a same clock frequency. In addition, the clock frequency can be reduced by half at a same transmission rate, so the electric power consumption and/or undesired electromagnetic radiation can be lowered.

In data communication apparatuses 299, 399, 599 and 799, because data is transmitted without encoding and modulation, and a signal line is provided exclusively for clock signals, it is easy to increase only signal lines for serial data transmission.

Further, the amount of transmitted data can be increased in proportion to the increment of signal lines for serial data transmission, and increase of circuits for frame synchronization can be suppressed.

The data communication apparatus 799 enables transmission and reception of additional data during detection of frame synchronization.

While the invention has been described with reference to specific embodiments chosen for purpose of illustration, it should be apparent that the present invention is not limited to these embodiments. Numerous modifications could be made thereto by those skilled in the art without departing from the basic concept and scope of the invention.

The synchronization data described in the above embodiments are generated in different ways. In the first embodiment, the synchronization data are generated by changing a signal several times within a cycle of a clock signal having a fixed cycle length. In the second and third embodiments the synchronization data are generated by extending the cycle length of a clock signal or the length of the low level so that a signal changes several times in this extended cycle or in the extended period of the low level.

However, the method for generating synchronization data, more specifically, the region in which a number of changes of a signal are detected, and the method to generate such a signal, are not limited to these cases.

For example, a number of changes of a signal may occur in the period of the high level of a clock signal.

In addition, with the period of the clock signal fixed, a signal may change several times in the period of the low level or high level of a clock signal.

Further, for data changing in a number of cycles of a clock signal, data signal may be made to change several times using the number of cycles as a unit.

Summarizing the effects of the present invention, according to data communication apparatus related to the present invention, frame synchronization in serial data transmission can be carried out using simple circuits and quickly.

As described above, according to the present invention, there can be provided a data communication apparatus of a new configuration able to transmit data while carrying out frame synchronization, and a transmitting circuit and a method thereof and a receiving circuit and a method thereof that able to be used in the data communication apparatus.

What is claimed is:

1. A transmitting circuit comprising:

a clock signal transmitting circuit for transmitting a clock signal through a first signal line;

a synchronization data generating circuit for generating synchronization data which represents a delimiter of serial data being transmitted of a predetermined unit length, and whose value changes two or more times in a predetermined time interval associated with the clock signal; and a data transmitting circuit for superposing the generated synchronization data on each serial data of the unit length and for synchronizing the serial data with the clock signal and transmitting the serial data through a second signal line;

wherein, as said synchronization data, said synchronization data generating circuit generates a set of data including inverted data of the last data of said unit-length serial data, and the last data after the inverted data;

wherein said synchronization data generating circuit generates data whose value changes two or more times within a period in which a level of the clock signal is constant, that is, from a rising edge to a next falling edge, or from a falling edge to a next rising edge of said clock signal; and wherein the predetermined time interval from a rising edge to a next rising edge of the clock signal, a frame synchronization data is transmitted and a next frame transmission is started.

* * * * *